US009958783B2

(12) United States Patent
Patra et al.

(10) Patent No.: US 9,958,783 B2
(45) Date of Patent: May 1, 2018

(54) ILLUMINATION SYSTEM FOR EUV PROJECTION LITHOGRAPHY

(71) Applicant: Carl Zeiss SMT GmbH, Oberkochen (DE)

(72) Inventors: Michael Patra, Oberkochen (DE); Ralf Mueller, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 15/152,670

(22) Filed: May 12, 2016

(65) Prior Publication Data
US 2016/0252823 A1 Sep. 1, 2016

Related U.S. Application Data

(63) Continuation of application No. PCT/EP2014/075257, filed on Nov. 21, 2014.

(30) Foreign Application Priority Data

Nov. 22, 2013 (DE) .......................... 10 2013 223 935

(51) Int. Cl.
*G03F 7/20* (2006.01)
(52) U.S. Cl.
CPC .......... *G03F 7/70183* (2013.01); *G03F 7/702* (2013.01); *G03F 7/70008* (2013.01);
(Continued)
(58) Field of Classification Search
CPC ............. G03F 7/70008; G03F 7/70058; G03F 7/70116; G03F 7/70183; G03F 7/702; G03F 7/70991
See application file for complete search history.

(56) References Cited

U.S. PATENT DOCUMENTS

| 5,896,438 A | 4/1999 | Miyake et al. |
| 6,438,199 B1 | 8/2002 | Schultz et al. |
| (Continued) | | |

FOREIGN PATENT DOCUMENTS

| CN | 1 400 507 A | 3/2003 |
| CN | 1 576 903 A | 2/2005 |
| (Continued) | | |

OTHER PUBLICATIONS

German Office Actin, with translation thereof, for corresponding DE Appl No. 10 2013 223 935.1, dated Jul. 21, 2014.
(Continued)

*Primary Examiner* — Steven H Whitesell Gordon
(74) *Attorney, Agent, or Firm* — Fish & Richardson P.C.

(57) ABSTRACT

An illumination system for EUV projection lithography has a beam shaping optical unit for generating an EUV collective output beam from an EUV raw beam of a synchrotron-radiation-based light source. An output coupling optical unit serves for generating a plurality of EUV individual output beams from the EUV collective output beam. In each case a beam guiding optical unit serves for guiding the respective EUV individual output beam toward an object field in which a lithography mask is arrangable. The result is an illumination system with which EUV light of a synchrotron-radiation-based light source is guided to the greatest possible extent without losses and at the same time flexibly.

22 Claims, 14 Drawing Sheets

(52) U.S. Cl.
CPC ...... *G03F 7/70058* (2013.01); *G03F 7/70991* (2013.01); *G03F 7/70116* (2013.01)

(56) References Cited

U.S. PATENT DOCUMENTS

| | | |
|---|---|---|
| 6,658,084 B2 | 12/2003 | Singer |
| 6,700,952 B2 | 3/2004 | Dinger et al. |
| 6,859,515 B2 | 2/2005 | Schultz et al. |
| 6,919,951 B2 | 7/2005 | Rsuji |
| 7,071,476 B2 | 7/2006 | Rothweiler et al. |
| 2003/0002022 A1 | 1/2003 | Schultz |
| 2003/0043359 A1 | 3/2003 | Naulleau |
| 2003/0043455 A1* | 3/2003 | Singer ............ B82Y 10/00 359/357 |
| 2004/0140440 A1 | 7/2004 | Schultz et al. |
| 2005/0024614 A1 | 2/2005 | Bakker |
| 2005/0243297 A1 | 11/2005 | Banine et al. |
| 2006/0158288 A1 | 7/2006 | Rossmanith et al. |
| 2008/0259303 A1 | 10/2008 | Ossmann et al. |
| 2009/0174876 A1 | 7/2009 | Schriever et al. |
| 2011/0014799 A1 | 1/2011 | Dinger et al. |
| 2016/0225477 A1* | 8/2016 | Banine ............ G02B 27/0025 |

FOREIGN PATENT DOCUMENTS

| | | |
|---|---|---|
| CN | 1 879 062 A | 12/2006 |
| DE | 103 58 225 B3 | 6/2005 |
| DE | 10 2008 014 832 A1 | 10/2008 |
| DE | 10 2009 025 655 A1 | 3/2010 |
| EP | 1 072 957 A2 | 1/2001 |
| WO | WO 2009/121438 A1 | 10/2009 |

OTHER PUBLICATIONS

Translation of International Search Report for corresponding PCT Appl. No. PCT/EP2014/075257, dated May 12, 2015.

Uwe Schindler, "Ein supraleitender Undulator mit elektrisch umschaltbarer Helizität" ["A superconducting undulator having electrically switchable helicity"], Karlsruhe Research Center in the Helmholtz association, scientific reports, FZKA 6997, Aug. 2004, (Abstract only at p. iii).

Chinese office action and Search Report, with English translation thereof, for corresponding Appl No. 2014 8006 3956.4, dated Apr. 25, 2017.

Chinese Office Action, with translation thereof, for corresponding CN Appl No. 201480063956.4, dated Feb. 14, 2018.

* cited by examiner

ILLUMINATION SYSTEM FOR EUV PROJECTION LITHOGRAPHY

CROSS-REFERENCE TO RELATED APPLICATIONS

The present application is a continuation of, and claims benefit under 35 USC 120 to, international application PCT/EP2014/075257, filed Nov. 21, 2014, which claims benefit under 35 USC 119 of German Application No. 10 2013 223 935.1, filed Nov. 22, 2013. The entire disclosure of international application PCT/EP2014/075257 and German Application No. 10 2013 223 935.1 are incorporated by reference herein.

FIELD

The disclosure relates to a beam guiding optical unit for an illumination system for EUV projection lithography. The disclosure furthermore relates to a beam shaping optical unit and a deflection optical unit for an illumination system for EUV projection lithography. In addition, the disclosure relates to an illumination system for EUV projection lithography and a projection exposure apparatus for EUV lithography. Finally, the disclosure relates to a method for producing a structured component, and a structured component produced according to this method.

BACKGROUND

A projection exposure apparatus including an illumination system is known from US 2011/0 014 799 A1, WO 2009/121 438 A1, US 2009/0 174 876 A1, U.S. Pat. No. 6,438,199 B1 and U.S. Pat. No. 6,658,084 B2. An EUV light source is known from DE 103 58 225 B3 and U.S. Pat. No. 6,859,515 B. Further component parts for EUV projection lithography are known from US 2003/0002022 A1, DE 10 2009 025 655 A1, U.S. Pat. No. 6,700,952 and US 2004/0140440 A. Further references from which an EUV light source is known are found in WO 2009/121 438 A1. EUV illumination optical units are furthermore known from US 2003/0043359 A1 and U.S. Pat. No. 5,896,438.

SUMMARY

The disclosure seeks to provide a deflection optical unit, a beam shaping optical unit and a beam guiding optical unit for an illumination system for EUV projection lithography, and an illumination system for EUV projection lithography in such a way that provision is made for EUV light of a synchrotron-radiation-based light source to be guided to the greatest possible extent without losses and at the same time flexibly.

The beam guiding of EUV light or EUV radiation, provided by a synchrotron-radiation-based light source, involves a specific conditioning on account of the properties of the EUV raw beam emitted by such a light source. This conditioning is ensured by the beam shaping optical unit according to the disclosure, the output coupling optical unit and the beam guiding optical unit and by the individual beam guiding component parts, namely the deflection optical unit and the focusing assembly.

The synchrotron-radiation-based light source can be a free electron laser (FEL), an undulator, a wiggler or an x-ray laser. The synchrotron-radiation-based light source can have an etendue of less than 0.1 mm$^2$ or an even smaller etendue. The optical units according to the disclosure can generally operate with the emission of a light source having such a small etendue, independently of whether a synchrotron-radiation-based light source is involved.

The beam shaping optical unit provides for a preshaping of a collective output beam from the raw beam in order to prepare for subsequent output coupling via the output coupling optical unit in individual output beams. The latter are guided to the respective object field by the beam guiding optical unit. This results in the possibility of illuminating a plurality of object fields using one and the same synchrotron-radiation-based light source, which in turn affords the possibility of supplying a plurality of projection exposure apparatuses which can be used to produce micro- or nano-structured components, for example semiconductor chips, in particular memory chips, via one and the same synchrotron-radiation-based light source.

Via the output coupling optical unit and the downstream beam guiding optical unit, it is possible to ensure a variable intensity distribution for the proportions of the radiation power in the different EUV individual output beams. It is thereby possible to carry out an adaptation to the number of projection exposure apparatuses to be supplied and an adaptation to the light power demanded by the respective projection exposure apparatus. Different desired properties which, for producing specific structures, are made of the light power respectively desired therefor can then also be fulfilled by corresponding adaptation of the illumination system.

A deflection optical unit for an illumination system for EUV projection lithography can include a plurality of deflection mirrors on which EUV radiation impinges in a common deflection incidence plane with grazing incidence, wherein at least four deflection mirrors for grazing incidence are provided which jointly have a deflection effect in the deflection incidence plane of more than 70°, and at least one of the deflection mirrors is embodied as a convex cylindrical mirror and/or at least one of the deflection mirrors is embodied as a concave cylindrical mirror. Such a deflection optical unit leads to low losses of the EUV radiation deflected by the deflection optical unit.

The mirrors for grazing incidence are designed for an angle of incidence of greater than 60°. The angle of incidence can be even greater.

At least one of the deflection mirrors for grazing incidence can be embodied as a convex cylindrical mirror. At least one of the deflection mirrors for grazing incidence can be embodied as a concave cylindrical mirror. Embodiments of the deflection optical unit can include a greater number of concave cylindrical mirrors than convex cylindrical mirrors.

An EUV beam incident in the deflection optical unit in a parallel fashion, in particular an EUV individual output beam, can have a divergence of less than 1 mrad after leaving the deflection optical unit. Such a design of the deflection optical unit makes it possible to be able to guide the EUV beam over a great distance.

At least one of the deflection mirrors can be embodied as displaceable in a driven fashion. In the case of such a deflection optical unit, an aspect ratio contribution of the beam guiding optical unit that is generated by the deflection optical unit can be adapted to a predefined value. By way of example, an expansion factor for the aspect ratio can be varied between a value 4 and a value 5 or between a value 1.5 and a value 2 in particular in a continuously variable fashion. At least one of the deflection mirrors for grazing incidence of the deflection optical unit can be embodied with a radius of curvature that is variable in a driven fashion. A further adaptation of the optical effect of the deflection optical unit to a predefined value can be achieved as a result.

A beam shaping optical unit for an illumination system for EUV projection lithography can include at least two groups of mirrors on which EUV radiation impinges with grazing incidence, wherein each mirror group has a common group incidence plane, and wherein the group incidence planes of the mirror groups differ from one another. In the case of such a beam shaping optical unit, the group incidence planes can be perpendicular to one another. Mirror groups of the beam shaping optical unit can include two mirrors, three mirrors or even more mirrors. The use of more mirror groups having different group incidence planes makes it possible to influence the EUV radiation in two transverse dimensions independently for generating a desired aspect ratio.

The mirror groups can be designed in the manner of Galilean telescopes.

The mirrors of the beam shaping optical unit can be embodied as e.g. convex or concave cylindrical mirrors.

The mirrors for grazing incidence are designed for an angle of incidence of greater than 60°. The angle of incidence can be even greater.

In some embodiments, all mirrors of one of the mirror groups are arranged in the beam path downstream of a first mirror of a further mirror group and upstream of a last mirror of the further mirror group. Such an arrangement affords the possibility of providing a large distance between those mirrors of one and the same mirror group which have to provide a large expansion factor, for example, for generating a desired aspect ratio.

In some embodiments, the angles of incidence of the EUV radiation on all mirrors of one of the mirror groups are of identical magnitude. Such angles of incidence of the EUV radiation enable a transmission optimization for the EUV radiation upon passing through the beam shaping optical unit.

In some embodiments, different angles of incidence of the EUV radiation on at least two mirrors of one of the mirror groups. Such angles of incidence increase a flexibility in the design of the beam shaping optical unit and make it possible, for example, to adapt a grazing incidence to a predefined beam diameter of the incident EUV beam such that a mirror size remains within predefined dimensions.

In some embodiments, projected onto the group incidence plane of the mirror group with different angles of incidence, the generated EUV collective output beam runs in the same direction as the EUV raw beam that is incident in the beam shaping optical unit. Such a design of the beam shaping optical unit makes it possible, for example, to guide horizontally both the beam incident in the beam shaping optical unit and the beam emerging from the beam shaping optical unit.

A divergence of the EUV collective output beam can be less than half a divergence of the EUV raw beam. A corresponding design of the beam shaping optical unit makes it possible to be able to guide the EUV collective output beam over a large distance.

At least one mirror of the beam shaping optical unit can have a deviation of at least 5 µm from a best fit conic. At least one mirror of the beam shaping optical unit can be embodied as a freeform surface. Corresponding mirror designs of the beam shaping optical unit increase the degrees of freedom for adapting an optical effect of the beam shaping optical unit to predefined values.

A beam guiding optical unit for an illumination system for EUV projection lithography can include a focusing assembly which transfers the respective EUV individual output beam into an intermediate focus of the beam guiding optical unit. Such a beam guiding optical unit makes it possible to guide the EUV radiation through a comparatively small passage opening through a stop or a wall. This enables a desired separation between different chambers in which the EUV radiation is guided. In addition, downstream of the intermediate focus it is possible to use assemblies of projection exposure apparatuses which are coordinated with an intermediate focus of the EUV illumination light with a predefined numerical aperture.

In some embodiments, the focusing assembly includes at least two mirrors, namely: at least one ellipsoidal mirror, on the one hand; and at least one paraboloidal mirror or at least one hyperboloidal mirror, on the other hand. Such a focusing assembly can be embodied in the manner of a type I, type II or type III Wolter mirror group. The at least two mirrors of the focusing assembly can be arranged sequentially in the beam path of the EUV individual output beam.

The focusing assembly can be embodied such that a structural space of the focusing assembly along a beam path of the EUV individual output beam is approximately double the magnitude of a major semiaxis of an ellipsoidal mirror of the focusing assembly. The focusing assembly can be embodied such that a structural space of the focusing assembly along a beam path of the EUV individual output beam is approximately fifty times the magnitude of a diameter of the EUV individual output beam upon entering the focusing assembly. The focusing assembly can be embodied such that for a ratio b/a of a minor semiaxis b of the ellipsoidal mirror and a major semiaxis a of the ellipsoidal mirror it holds true that: $0.7NA < b/a < 0.9NA$, wherein NA denotes the numerical aperture at the intermediate focus of the focusing assembly.

The focusing assembly can be embodied such that it includes at least one paraboloidal mirror, wherein for a ratio a/f of a major semiaxis a of the ellipsoidal mirror and a focal length f of the paraboloidal mirror it holds true that: $a/f > 50$.

The focusing assembly can be embodied such that a smallest deflection angle experienced by a marginal ray of the EUV individual output beam through the focusing assembly is not greater than 5°.

The object is furthermore achieved via an illumination system including a beam shaping optical unit, an output coupling optical unit and in each case a beam guiding optical unit. The beam shaping optical unit and/or the output coupling optical unit and/or the beam guiding optical unit can be embodied in particular in accordance with the preceding description. The advantages are evident from those described for the respective component parts.

An illumination system for EUV projection lithography can include a beam shaping optical unit for generating an EUV collective output beam from an EUV raw beam of a synchrotron-radiation-based light source, and an output coupling optical unit for generating a plurality of EUV individual output beams from the EUV collective output beam, and in each case a beam guiding optical unit for guiding the respective EUV individual output beam toward an object field, in which a lithography mask is arrangable. Such an illumination system makes it possible to provide a plurality of EUV individual output beams with a predefined aspect ratio of an EUV beam diameter. The aspect ratio contributions provided by the beam shaping optical unit, on the one hand, and by the output coupling optical unit and the downstream beam guiding optical unit, on the other hand, can also be multiplied by a desired setpoint aspect ratio, for example by the aspect ratio of an object field to be illuminated. The generation of a desired aspect ratio contribution of the plurality of individual output beams of 1:1, proceeding from the raw beam, is allocated firstly to the generation of an aspect ratio contribution not equal to 1 via the beam shaping optical unit and, after the splitting of the collective output beam into the plurality of individual output beams, by the generation of a corresponding aspect ratio contribution by the output coupling optical unit and the beam guiding optical unit. This makes possible, on the path of the EUV illumination light from the light source as far as the object field, moderate aspect ratio changes that have to be brought about by the various optical assemblies through which the EUV beam passes. Alternatively, with the beam shaping optical unit firstly it is also possible to generate a different aspect ratio contribution, for example an aspect ratio contribution of 1:N for N EUV individual output beams. A downstream output coupling optical unit then still has to split the EUV collective output beam thus generated, but then does not require its own aspect-ratio-influencing effect for predefining the EUV individual output beams with the aspect ratio contribution of in each case 1:1. A different distribution of the aspect ratio contributions generated by the beam shaping optical unit, on the one hand, and by the output coupling optical unit and the beam guiding optical unit, on the other hand, for generating a number N of EUV individual output beams with an aspect ratio contribution of in each case 1:1 is also possible.

The advantages of a projection exposure apparatus, of a production method and of a structured component disclosed herein can correspond to those which have already been explained above.

The light source of the illumination system can be a free electron laser (FEL), an undulator, a wiggler or an x-ray laser.

The EUV collective output beam can have within a used cross section an intensity distribution that deviates from a homogeneous intensity by less than 10% at every point of the used cross section. A respective EUV individual output beam can have a corresponding homogeneity downstream of the deflection optical unit.

All the mirrors of the illumination system can bear highly reflective coatings.

The beam shaping optical unit, the deflection optical unit and the focusing assembly are assemblies which are also to be considered autonomously, that is to say without the further assemblies of the illumination system.

All features of the claims can also be combined with one another in a different combination.

BRIEF DESCRIPTION OF THE DRAWINGS

Exemplary embodiments of the disclosure are explained in greater detail below with reference to the drawing. In the drawing.

DETAILED DESCRIPTION

Figure 1:
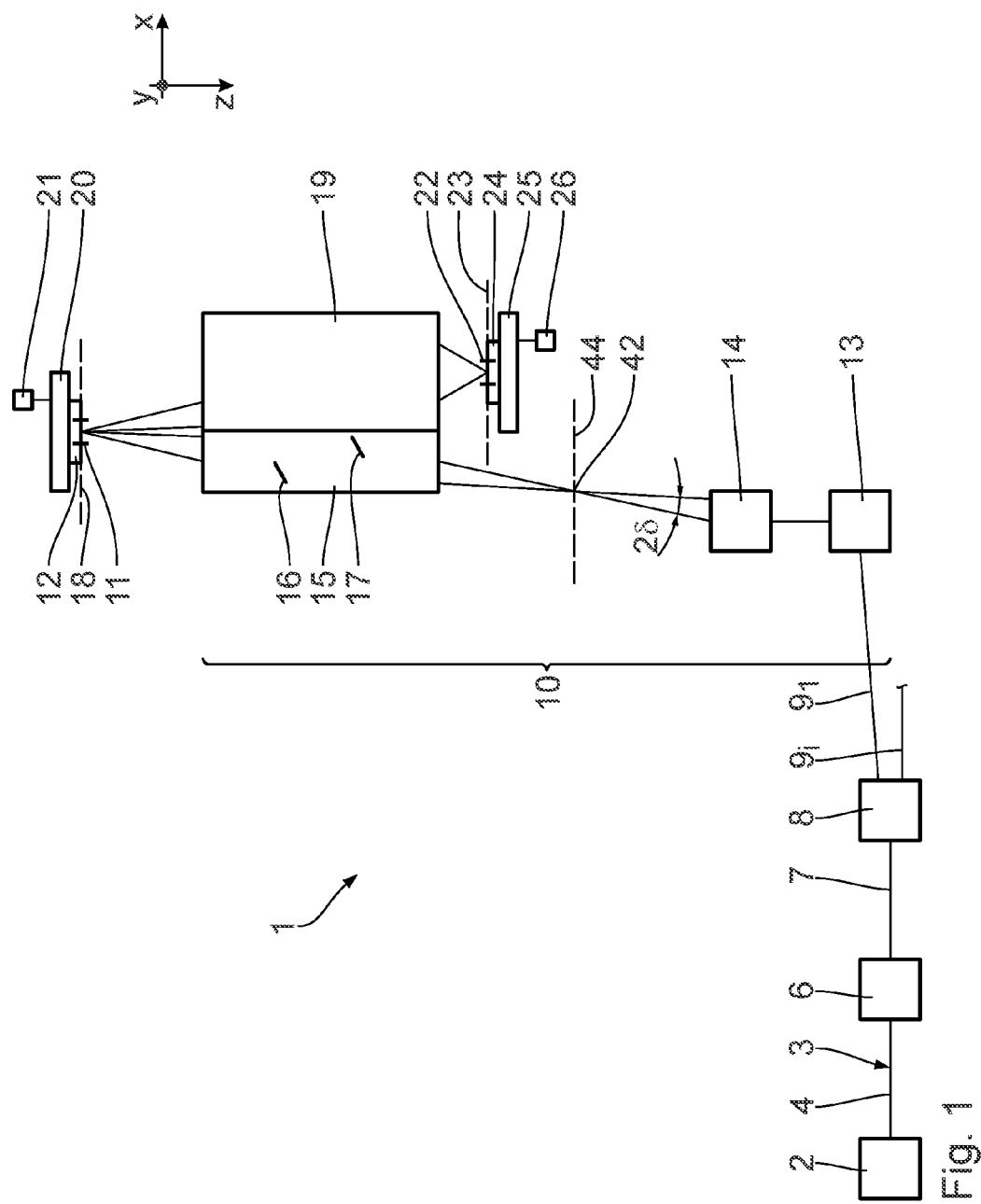
FIG. 1 schematically shows a projection exposure apparatus for EUV projection lithography.

A projection exposure apparatus 1 for microlithography is part of a system including a plurality of projection exposure apparatuses, of which FIG. 1 illustrates one of the projection exposure apparatuses 1. The projection exposure apparatus 1 serves for producing a micro- or nanostructured electronic semiconductor component. A light or radiation source 2 common to all the projection exposure apparatuses of the system emits EUV radiation in the wavelength range of, for example, between 2 nm and 30 nm, in particular between 2 nm and 15 nm. The light source 2 is embodied as a free electron laser (FEL). This involves a synchrotron radiation source or a synchrontron-radiation-based light source which generates coherent radiation having very high brilliance. Publications that describe such FELs are indicated in WO 2009/121 438 A1. A light source 2 that can be used, for example, is described in Uwe Schindler "Ein supraleitender Undulator mit elektrisch umschaltbarer Helizität" ["A superconducting undulator having electrically switchable helicity"], Karlsruhe Research Center in the Helmholtz association, scientific reports, FZKA 6997, August 2004, in US 2007/0152171 A1 and in DE 103 58 225 B3.

The light source 2 has an original etendue that is less than 0.1 mm$^2$ in a raw beam. The etendue is the smallest volume of a phase space which contains 90% of the light energy of an emission of a light source. Definitions of etendue that correspond thereto are found in EP 1 072 957 A2 and U.S. Pat. No. 6,198,793 B1, which indicate that the etendue is obtained by multiplication of the illumination data x, y and NA$^2$, where x and y are the field dimensions sions which span an illuminated illumination field and NA is the numerical aperture of the field illumination. Even smaller etendues of the light source than 0.1 mm$^2$ are possible, for example an etendue of less than 0.01 mm$^2$.

The EUV light source 2 has an electron beam supply device for generating an electron beam and an EUV generation device. The latter is supplied with the electron beam via the electron beam supply device. The EUV generation device is embodied as an undulator. The undulator can optionally include undulator magnets that are adjustable by displacement. The undulator can include electromagnets. A wiggler can also be provided in the case of the light source 2.

The light source 2 has an average power of 2.5 kW. The pulse frequency of the light source 2 is 30 MHz. Each individual radiation pulse then carries an energy of 83 µJ. Given a radiation pulse length of 100 fs, this corresponds to a radiation pulse power of 833 MW.

A repetition rate of the light source 2 can be in the kilohertz range, for example at 100 kHz, or in the relatively low megahertz range, for example at 3 MHz, in the medium megahertz range, for example at 30 MHz, in the upper megahertz range, for example at 300 MHz, or else in the gigahertz range, for example at 1.3 GHz.

A Cartesian xyz-coordinate system is used below in order to facilitate the illustration of positional relationships. The x-coordinate together with the y-coordinate in these illustrations regularly spans a beam cross section of the EUV illumination and imaging light 3. Correspondingly, the z-direction regularly runs in the beam direction of the illumination and imaging light 3. The x-direction runs vertically for example in FIGS. 2 and 12, that is to say perpendicularly to building planes in which the system of the projection exposure apparatuses 1 is accommodated. The coordinate system in FIGS. 4 to 11 is rotated with respect thereto by 90° about the z-axis.

FIG. 1 shows main components of one of the projection exposure apparatuses 1 of the system highly schematically.

Figure 3:
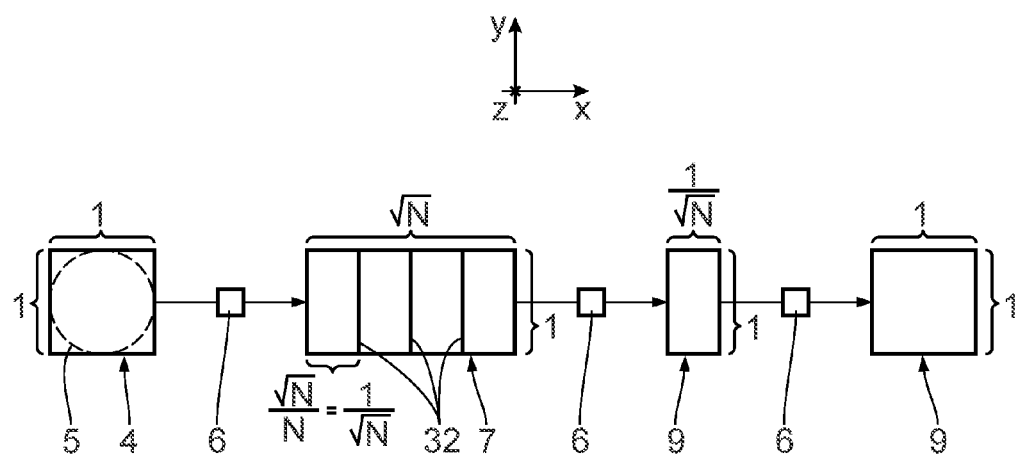
FIG. 3 shows cross-section ratios of the EUV radiation in the course of the EUV beam path between the light source and the beam guiding in an illumination optical unit disposed upstream of an object field of the projection exposure apparatus.

The light source 2 imitates illumination and imaging light 3 in the form firstly of an EUV raw beam 4. FIG. 3 shows highly schematically on the left a cross section through the EUV raw beam 4 with an x/y aspect ratio of 1:1. In general, the raw beam 4 is present as a beam having a Gaussian intensity profile, that is to say as a beam that is round in cross section, which is indicated by a dashed boundary line 5 in FIG. 3. The EUV raw beam 4 has a very low divergence.

A beam shaping optical unit 6 (cf. FIG. 1) serves for generating an EUV collective output beam 7 from the EUV raw beam 4. This is illustrated very highly schematically in FIG. 1 and somewhat less highly schematically in FIG. 2. The EUV collective output beam 7 has a very low divergence. FIG. 3 elucidates, in the second cross-sectional illustration from the left, once again an aspect ratio of the EUV collective output beam 7. The aspect ratio is predefined by the beam shaping optical unit 6 depending on a number N of the projection exposure apparatuses 1 to be supplied by the light source 2 within the system. The x/y aspect ratio generated by the beam shaping optical unit 6 is generally $\sqrt{N}:1$, wherein a rectangular beam profile of the illumination light 3 results, as illustrated in FIG. 3. The EUV collective output beam 7 has the shape of a homogeneously illuminated rectangle. The aspect ratio contribution $\sqrt{N}:1$ can also be multiplied by a desired setpoint aspect ratio, for example by the aspect ratio of an object field to be illuminated.

Figure 2:
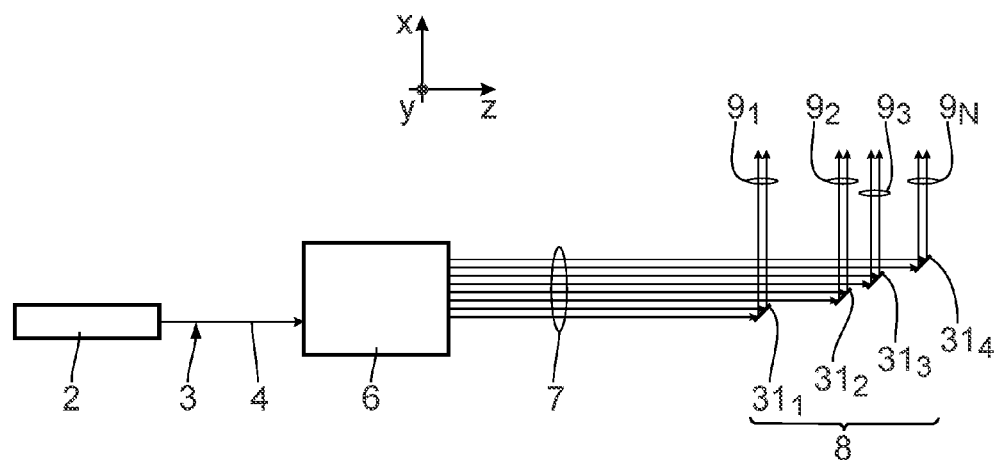
FIG. 2 likewise schematically shows a guiding section of an EUV beam path for a system of a plurality of projection exposure apparatuses according to FIG. 1, proceeding from an EUV light source for generating an EUV raw beam to downstream of an output coupling optical unit for generating a plurality of EUV individual output beams from an EUV collective output beam.

FIG. 2 indicates a system design where N=4, in which the light source 2 therefore supplies four projection exposure apparatuses according to the type of the projection exposure apparatus 1 according to FIG. 1, with the illumination light 3. For N=4, the x/y aspect ratio of the EUV collective output beam 7 is 2:1. The number N of projection exposure apparatuses 1 can also be even greater and can be up to 10, for example.

In an alternative system design, the EUV collective output beam has an x/y aspect ratio of N:1. This ratio, too, can also be multiplied by a desired setpoint aspect ratio.

An output coupling optical unit 8 (cf. FIGS. 1 and 2) serves for generating a plurality of, namely N, EUV individual output beams $9_1$ to $9_N$ (i=1, . . . N) from the EUV collective output beam 7.

FIG. 1 shows the further guidance of exactly one of the EUV individual output beams 9, namely of the output beam $9_1$. The other EUV individual output beams $9_i$ generated by the output coupling optical unit 8, which is likewise indicated schematically in FIG. 1, are fed to other projection exposure apparatuses of the system.

Downstream of the output coupling optical unit 8, the illumination and imaging light 3 is guided by a beam guiding optical unit 10 (cf. FIG. 1) towards an object field 11 of the projection exposure apparatus 1, there being arranged in the object field a lithography mask 12 in the form of a reticle as object to be projected. Together with the beam guiding optical unit 10, the beam shaping optical unit 6 and the output coupling optical unit 8 constitute an illumination system for the projection exposure apparatus 1.

The beam guiding optical unit 10 includes, in the order of the beam path for the illumination light 3, that is to say for the EUV individual output beam $9_i$, a deflection optical unit 13, an input coupling optical unit in the form of a focusing assembly 14 and a downstream illumination optical unit 15. The illumination optical unit 15 includes a field facet mirror 16 and a pupil facet mirror 17, the function of which corresponds to that known from the prior art and which are therefore merely illustrated extremely schematically and without an associated EUV beam path in FIG. 1.

After reflection at the field facet mirror 16, the used radiation beam of the illumination light 3, the used radiation beam being divided into EUV sub-beams assigned to individual field facets (not illustrated) of the field facet mirror 16, impinges on the pupil facet mirror 17. Pupil facets (not illustrated in FIG. 1) of the pupil facet mirror 17 are round. One of the pupil facets is assigned to each sub-beam of the used radiation beam that is reflected from one of the field facets, such that a pair of facets impinged on and including one of the field facets and one of the pupil facets in each case predefines an illumination channel or beam guiding channel for the associated sub-beam of the used radiation beam. The channel-by-channel assignment of the pupil facets to the field facets is effected depending on a desired illumination by the projection exposure apparatus 1. The illumination light 3 is therefore guided for predefining individual illumination angles along the illumination channel sequentially via pairs including a respective one of the field facets and a respective one of the pupil facets. For driving respectively predefined pupil facets, the field facet mirrors are in each case tilted individually.

Via the pupil facet mirror 17 and, if appropriate, via a downstream transfer optical unit consisting of, for example, three EUV mirrors (not illustrated), the field facets are imaged into the illumination or object field 11 in a reticle or object plane 18 of a projection optical unit 19 (likewise illustrated schematically in FIG. 1) of the projection exposure apparatus 1.

From the individual illumination angles that are brought about via all the illumination channels via an illumination of the field facets of the field facet mirror 16, there results an illumination angle distribution of the illumination of the object field 11 by the illumination optical unit 15.

In a further embodiment of the illumination optical unit 15, in particular given a suitable position of an entrance pupil of the projection optical unit 19, it is also possible to dispense with the mirrors of the transfer optical unit upstream of the object field 11, which leads to a corresponding increase in the transmission of the projection exposure apparatus 1 for the used radiation beam.

The reticle 12, which reflects the used radiation beam, is arranged in the object plane 18 in the region of the object field 11. The reticle 12 is carried by a reticle holder 20, which is displaceable in a manner driven via a reticle displacement drive 21.

The projection optical unit 19 images the object field 11 into an image field 22 in an image plane 23. During the projection exposure, a wafer 24 is arranged in the image plane 23, the wafer bearing a light-sensitive layer which is exposed during the projection exposure by the projection exposure apparatus 1. The wafer 24 is carried by a wafer holder 25, which is in turn displaceable in a manner controlled via a wafer displacement drive 26.

During the projection exposure, both the reticle 12 and the wafer 24 in FIG. 1 are scanned in a synchronized manner in the x-direction by corresponding driving of the reticle displacement drive 21 and of the wafer displaceable drive 26. The wafer is scanned at a scan rate of typically 600 mm/s in the x-direction during the projection exposure.

Figure 4:
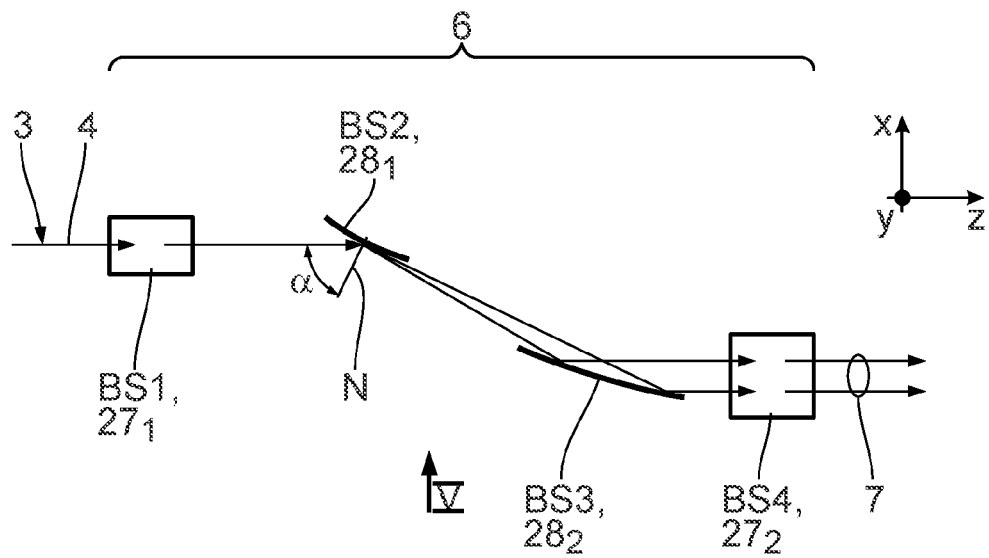
FIG. 4 shows a side view of a beam shaping optical unit for generating the EUV collective output beam from the EUV raw beam.
Figure 5:
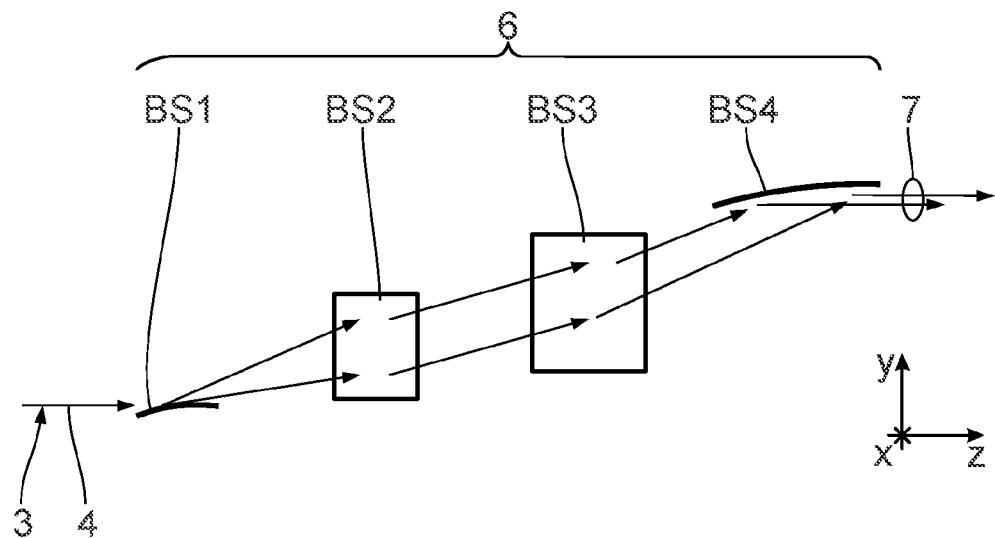
FIG. 5 shows a further side view from direction V in FIG. 4.

FIGS. 4 and 5 show an embodiment of the beam shaping optical unit 6. The beam shaping optical unit 6 according to FIGS. 4 and 5 has a total of four mirrors BS1, BS2, BS3 and BS4, which are numbered consecutively in the order in which the illumination light 3 impinges on them. FIG. 4 shows the beam shaping optical unit 6 in a view parallel to the xz-plane. FIG. 5 shows the beam shaping optical unit 6 in a plan view parallel to the yz-plane.

The illustration of beam deflection by the mirrors BS1 to BS4 of the beam shaping optical unit 6 in FIGS. 4 and 5 is a departure from reality in so far as the mirrors BS1 and BS4 in FIG. 4 and the mirrors BS2 and BS3 in FIG. 5 are in each case both illustrated in the plan view with the reflection surface facing the observer. In actual fact, a reflection surface of the mirror BS4 in FIG. 4 and a reflection surface of the mirror BS3 in FIG. 5 face away from the observer.

The illumination light 3 impinges on all of the mirrors BS1 to BS4 with grazing incidence. Grazing incidence is present if an angle α of incidence between a principal direction of incidence or reflection of the illumination light 3 and a normal N to a reflection surface section of the respective mirror on which the illumination light 3 impinges is greater than 60°. The angle α of incidence can for example be greater than 65°, can be greater than 70° and can also be greater than 75°.

The beam shaping optical unit 6 according to FIGS. 4 and 5 has two beam shaping mirror groups 27, 28, namely firstly the beam shaping mirror group 27 including the mirrors BS1 and BS4, which are also designated by $27_1$ and $27_2$ in FIG. 4, and the beam shaping mirror group 28 including the mirrors BS2 and BS3, which are also designated by $28_1$ and $28_2$ in FIG. 5. Each mirror group 27, 28 has a common group incidence plane. The incidence plane of the mirror group 27 is parallel to the yz-plane (plane of the drawing in FIG. 5). The group incidence plane of the mirror group 28 is parallel to the xz-plane (plane of the drawing in FIG. 4). The two group incidence planes yz and xz of the mirror groups 27, 28 thus differ from one another and are perpendicular to one another in the embodiment illustrated.

The beam shaping mirror group 27 serves for the beam shaping of the EUV collective output beam 7 in the yz-plane. The beam shaping mirror group 28 serves for the beam shaping of the EUV collective output beam 7 in the xz-plane.

The beam shaping mirror group 27, on the one hand, and 28, on the other hand, have in principle the effect of a Galilean cylindrical telescope. In order to achieve a reshaping of the beam profile, for example from a substantially round raw beam 4 having a Gaussian intensity profile into a substantially rectangular EUV collective output beam 7 having a homogeneous intensity profile within a rectangular used cross section, at least some of the mirrors of the beam shaping mirror groups 27 and/or 28 can be provided with a freeform profile, that is to say have a freeform surface as reflection surface. A freeform profile is a height profile which is not representable as a conic. Conic here should also be understood to mean a surface shape which is described by a different conic in two orthogonal directions; one example of such a surface shape is a cylinder. A freeform profile is not describable by such a conic either. The deviation of the height profile of one or more mirrors of the beam shaping optical unit 6 can be more than 1 micrometer (µm), in particular more than 5 micrometers and in particular more than 20 micrometers.

The mirror group 28 including the mirrors BS2 and BS3 is arranged overall in the beam path downstream of the first mirror BS1 of the further mirror group 27 and upstream of the second and last mirror BS4 of the further mirror group 27.

Depending on the embodiment of the beam shaping optical unit 6, the angles of incidence of the illumination light 3 can be of identical magnitude on all mirrors of one of the mirror groups 27, 28 or can be of different magnitudes on at least two mirrors of one of the mirror groups 27, 28. In this context, angle of incidence is understood to mean the angle of incidence of a ray running centrally in the EUV raw beam 4.

The mirror BS1 is embodied as a convex cylindrical mirror, the cylinder axis of which runs parallel to the x-axis. The mirror BS2 is embodied as a convex cylindrical mirror, the cylinder axis of which runs parallel to the y-axis. The mirror BS3 is embodied as a concave cylindrical mirror, the cylinder axis of which runs parallel to the y-direction. The mirror BS4 is embodied as a concave cylindrical mirror, the cylinder axis of which runs parallel to the x-axis.

The mirror group 27 provides for an expansion of a beam diameter of the raw beam in the x-dimension by a factor of 2 in comparison with the expanding effect of the mirror group 28 in the y-dimension. Furthermore, the two mirror groups 27, 28 serve for shaping the rectangular cross-sectional contour of the EUV collective output beam 7.

FIGS. 6 to 11 show further embodiments of the beam shaping optical unit 6. These embodiments differ in the sequence of the deflection angles generated via the various beam shaping mirrors BSi (i=1, . . . ). Therefore, in FIGS. 6 to 11, only the deflection effect of the mirrors BSi is illustrated in each case, without the mirrors themselves being physically indicated.

Figure 6:
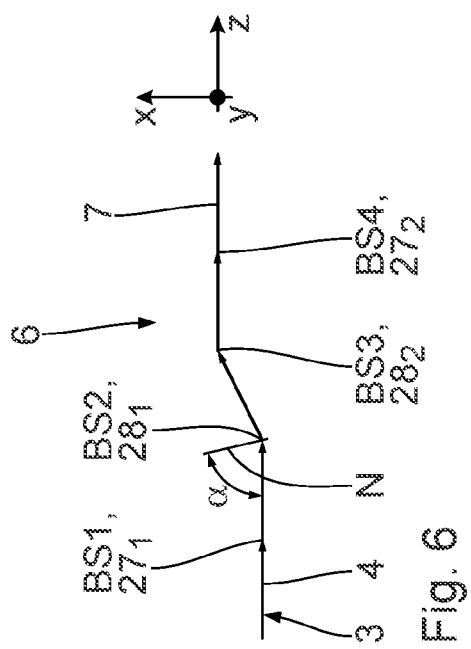
FIGS. 6 and 7 show highly schematically the beam shaping optical unit according to FIGS. 4 and 5 for clarifying deflection angles that are brought about by mirrors of the beam shaping optical unit.
Figure 7:
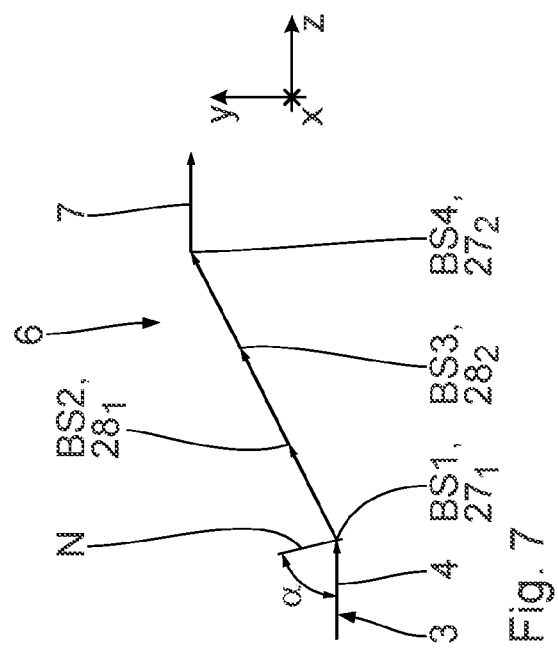

The embodiment of the beam shaping optical unit 6 according to FIGS. 6 and 7 corresponds to the embodiments according to FIGS. 4 and 5 with regard to the angles of incidence of the illumination light 3 on the mirrors BS1 to BS4 and also with regard to the assignment of the mirrors BS1 to BS4 to the mirror groups 27, 28. The angles α of incidence of the illumination light 3 at the mirrors BS1 to BS4 are identical for all these mirrors in the case of the embodiment according to FIGS. 6 and 7. A principal beam direction of the EUV collective output beam 7 is thus identical to the principal beam direction of the EUV raw beam 4 incident in the beam shaping optical unit 6.

Figure 8:
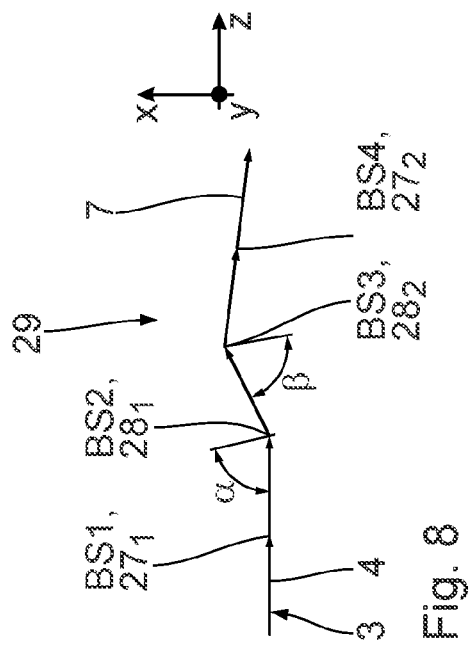
FIGS. 8 and 9 show, in an illustration similar to FIGS. 6 and 7, a further embodiment of a beam shaping optical unit.
Figure 9:
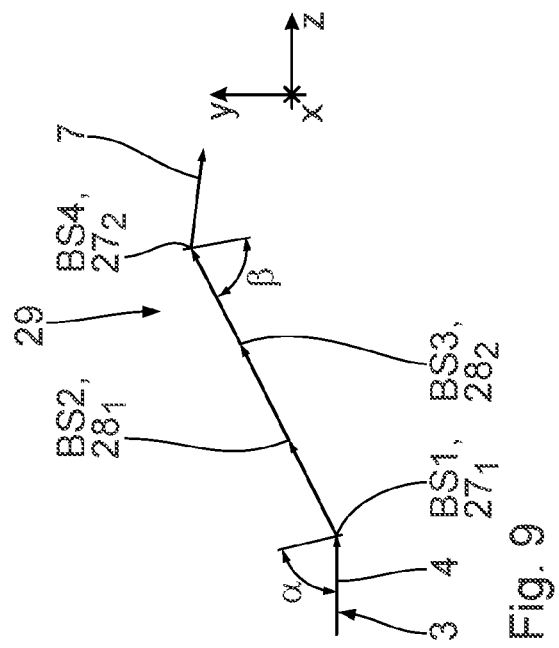

FIGS. 8 and 9 show a further embodiment of a beam shaping optical unit 29 which can be used instead of the beam shaping optical unit 6 according to FIGS. 4 to 7. Component parts and functions corresponding to those which have already been explained above with reference to the beam shaping optical unit 6 bear the same reference signs in the case of the beam shaping optical unit 29 and will not be discussed in detail again.

In contrast to the beam shaping optical unit 6, different angles α, β of incidence of the EUV radiation on the mirrors BS1 to BS4 are present in the case of the beam shaping optical unit 29. The mirrors BS1 and BS2 reflect in each case with the angle α of incidence, such that the beam path of the beam shaping optical unit 29 as far as the third mirror BS3 corresponds to the beam path in the beam shaping optical unit 6. At the mirrors BS3 and BS4, the illumination light 3 is reflected at a smaller angle β of incidence in comparison with the angle α of incidence, but still with grazing incidence. This has the effect that a principal beam direction of the EUV collective output beam 7 emerging from the beam shaping optical unit 29 does not run parallel to the z-direction, but rather forms both in the xz-plane and in the yz-plane an angle different than zero with respect to the incidence direction running parallel to the z-direction.

The smaller angles β of incidence at the last two mirrors BS3 and BS4 of the beam shaping optical unit 29 enable a structurally smaller embodiment of the last two mirrors BS3 and BS4, that is to say an embodiment having a small extended reflection surface. This is of greater significance for the last two mirrors BS3 and BS4 of the beam shaping optical unit 29 than for the two leading mirrors BS1 and BS2, since at the location of the last mirrors BS3 and BS4 the illumination light is already significantly expanded in cross section in comparison with the incident EUV raw beam.

Figure 10:
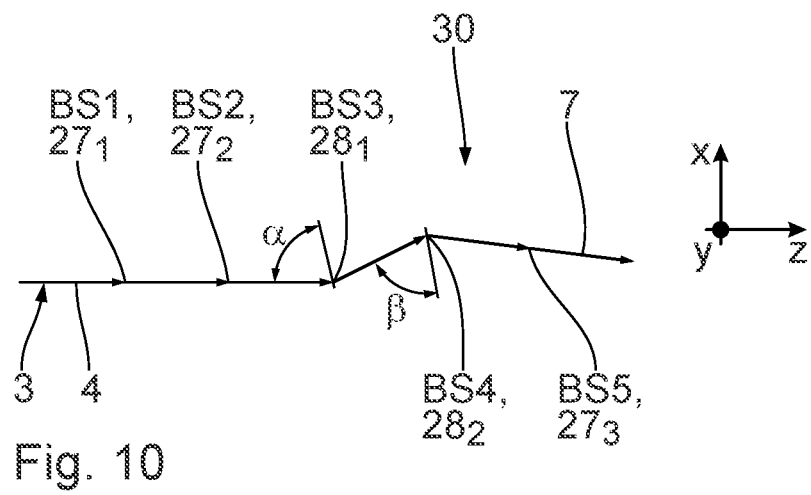
FIGS. 10 and 11 show, in an illustration similar to FIGS. 6 and 7, a further embodiment of a beam shaping optical unit.
Figure 11:
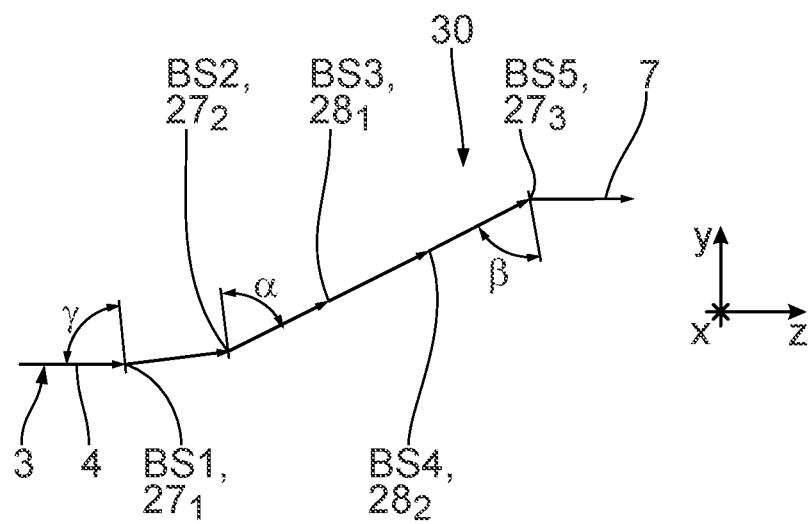

FIGS. 10 and 11 show a further embodiment of a beam shaping optical unit 30 that can be used instead of the beam shaping optical units 6, 29. Component parts and functions corresponding to those which have already been explained above with reference to the beam shaping optical units 6, 29 bear the same reference signs in the case of the beam shaping optical unit 30 and will not be discussed in detail again.

The beam shaping optical unit 30 has a total of five beam shaping mirrors BS1, BS2, BS3, BS4, BS5, which are once again numbered consecutively in the order in which the illumination light 3 impinges on them within the beam shaping optical unit 30. The mirrors BS1, BS2 and BS5 belong to the first mirror group 27 of the beam shaping optical unit 30 with a yz incidence plane. The two remaining mirrors BS3 and BS4 belong to the mirror group 28 with an xz incidence plane.

After reflection at the first mirror BS1, the beam path of the illumination light 3 in the beam shaping optical unit 30 corresponds to that in the beam shaping optical unit 29, wherein the mirrors BS2 to BS5 of the beam shaping optical unit 30 then have the function of the mirrors BS1 to BS4 of the beam shaping optical unit 29.

The illumination light 3, that is to say the EUV raw beam 4, impinges on the first mirror BS1 of the beam shaping optical unit 30 with highly grazing incidence. An angle γ of incidence of the illumination light 3 on the first mirror BS1 of the beam shaping optical unit 30 is therefore greater than the angle α of incidence. The angle γ of incidence has a magnitude such that it exactly compensates for a beam direction difference of the illumination light 3 that is manifested by the illumination light 3 between the mirrors BS1 and BS2, on the one hand, and downstream of the mirror BS5, on the other hand, in the yz-plane, such that a principal beam direction of the illumination light 3 in the yz-plane after emerging from the beam shaping optical unit 30 is parallel to the principal beam direction in the yz-plane upon entering the beam shaping optical unit 30, namely parallel to the z-direction.

Upstream and downstream of the beam shaping optical unit 30, the illumination light 3 runs parallel to the building ceilings of the building in which the system is accommodated.

Projected onto the group incidence plane yz of the mirror group 27 of the beam shaping optical unit 30, in which the individual mirrors $27_1$ (BS1), $27_2$ (BS2) and $27_3$ (BS5) have different angles of incidence, namely γ, α and β, the EUV collective output beam 7 generated by the beam shaping optical unit 30 runs in the same direction, namely in the z-direction, as the EUV raw beam 4 that is incident in the beam shaping optical unit 30.

A typical cross-sectional dimension of reflection surfaces of the last mirror BS4 and BS5 of the beam shaping optical unit 6 and 30, respectively, is 1 m to 1.5 m, wherein these mirrors typically have a reflection surface that is rectangular to a first approximation, and the specified cross-sectional dimension relates to the longer of the two axes. A typical cross-sectional dimension of reflection surfaces of the first mirror BS1 of the beam shaping optical unit is 20 mm to 100 mm.

After leaving the beam shaping optical unit 6 or 30, the rays of the EUV collective output beam 7 run substantially parallel. The divergence of the EUV collective output beam 7 can be less than 10 mrad, in particular less than 1 mrad, in particular less than 100 μrad and in particular less than 10 μrad.

Figure 12:
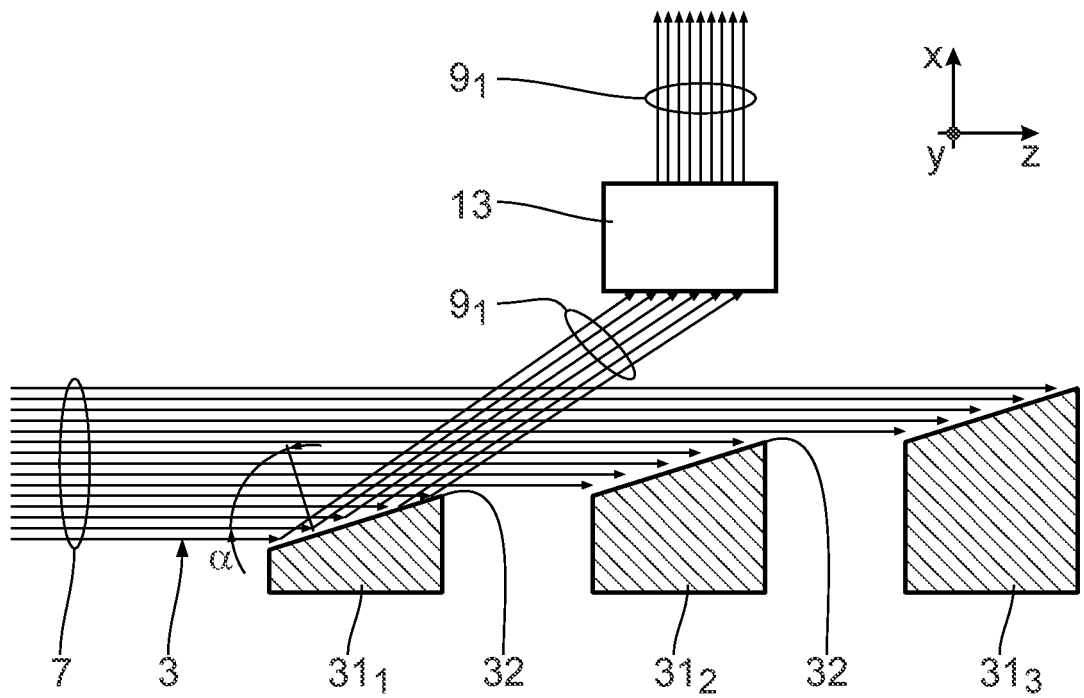
FIG. 12 shows, less schematically than in FIGS. 1 and 2, an EUV beam path between the beam shaping optical unit and a deflection optical unit as part of a beam guiding optical unit for guiding the respective EUV individual output beam toward the object field, wherein the deflection optical unit is disposed downstream of the output coupling optical unit in the beam path of the EUV individual output beam.

FIGS. 2 and 12 show examples of the output coupling optical unit 8 for generating the EUV individual output beams 9 from the EUV collective output beam 7. The output coupling optical unit has a plurality of output coupling mirrors $31_1$, $31_2$, . . . , which are assigned to the EUV individual output beams $9_1$, $9_2$, . . . and couple out the latter from the EUV collective output beam 7. FIG. 2 shows an arrangement of the output coupling mirrors 31 in such a way that the illumination light 3 is deflected during coupling out by 90° by the output coupling mirrors 31. Preference is given to an embodiment in which the output coupling mirrors 31 are operated with grazing incidence of the illumination light 3, as shown schematically in FIG. 12. In the embodiment according to FIG. 2, an angle α of incidence of the illumination light 3 on the output coupling mirrors 31 is approximately 70°, but can also be even significantly above that and be in the region of 85°, for example, such that an effective deflection of the EUV individual output beam 9 by the respective output coupling mirror 31 in comparison with the direction of incidence of the EUV collective output beam 7 is 10°.

Each of the output coupling mirrors $31_i$ is thermally coupled to a heat sink (not illustrated in more detail).

FIG. 2 shows an output coupling optical unit 8 having a total of four output coupling mirrors $31_1$ to $31_4$. FIG. 12 shows a variant of the output coupling optical unit 8 having a total of three output coupling mirrors $31_1$ to $31_3$. A different number N of output coupling mirrors 31 is also possible, depending on the number N of projection exposure apparatuses 1 to be supplied by the light source 2, for example N=2 or N≥4, in particular N≥8.

After the coupling out, each of the EUV individual output beams 9 has an x/y aspect ratio of $1/\sqrt{N}$:1. The second cross-sectional illustration from the right in FIG. 3 illustrates one of the EUV individual output beams 9 with this aspect ratio. For the case N=4, the x/y aspect ratio is thus 1:2. This aspect ratio contribution, too, can also be multiplied by the desired setpoint aspect ratio.

The output coupling mirrors $31_i$ (i=1, 2, . . . ) are arranged in the beam path of the EUV collective output beam 7 in an offset manner one behind another in the beam direction of the EUV collective output beam 7 such that the respective closest output coupling mirror $31_i$ reflects a marginal cross-sectional proportion of the EUV collective output beam 7 and thereby couples out the cross-sectional proportion as EUV individual output beam $9_i$ from the remaining EUV collective output beam 7 flying past the output coupling mirror $31_i$. This output coupling from the edge is repeated by the following output coupling mirrors $31_{i+1}$, . . . , until the last still remaining cross-sectional proportion of the EUV collective output beam 7 is coupled out.

In the cross section of the EUV collective output beam 7, a separation is carried out between the cross-sectional proportions assigned to the EUV individual output beams $9_i$ on separating lines 32 running parallel to the y-axis, that is to say parallel to the shorter side of the x/y rectangular cross section of the EUV collective output beam 7. The separation of the EUV individual output beams $9_i$ can be carried out in such a way that in each case the cross-sectional proportion that is the furthest away from the next optical component part in the beam path is cut off. This facilitates the cooling of the output coupling optical unit 8, inter alia.

The deflection optical unit 13 downstream of the output coupling optical unit 8 in the beam path of the illumination light 3 serves firstly for deflecting the EUV individual output beams 9 such that they each have a vertical beam direction downstream of the deflection optical unit 13, and secondly for adapting the x/y aspect ratio of the EUV individual output beams 9 to an x/y aspect ratio of 1:1, as illustrated on the far right in FIG. 3. This aspect ratio contribution, too, can also be multiplied by the desired setpoint aspect ratio. The above x/y aspect ratios are thus aspect ratio contributions which, multiplied by a setpoint aspect ratio, for example the aspect ratio of a rectangular or arcuate object field, yield a desired actual aspect ratio. The above x/y setpoint aspect ratios can be the aspect ratio of a first optical element of an illumination optical unit 15. The above x/y setpoint aspect ratios can be the aspect ratio of the angles of the illumination light 3 at an intermediate focus 42 of an illumination optical unit 15.

For the case where a vertical beam path of the EUV individual output beams 9 is already present downstream of the output coupling optical unit 8, a deflecting effect of the deflection optical unit 13 can be dispensed with and the adaptation effect with regard to the x/y aspect ratio of the EUV individual output beams 9 suffices.

The EUV individual output beams 9 downstream of the deflection optical unit 13 can pass in such a way that, if appropriate after passing through a focusing assembly 14, they are incident in the illumination optical unit 15 at an angle, wherein this angle allows an efficient folding of the illumination optical unit. Downstream of the deflection optical unit 13, the EUV individual output beam $9_i$ can pass at an angle of 0° to 10° with respect to the perpendicular, at an angle of 10° to 20° with respect to the perpendicular, or at an angle of 20° to 30° with respect to the perpendicular.

Various variants for the deflection optical unit 13 are described below with reference to FIGS. 13 to 19. In this case, the illumination light 3 is illustrated schematically as a single ray, that is to say that a beam illustration is dispensed with.

The divergence of the EUV individual output beam $9_i$, after passing through the deflection optical unit is less than 10 mrad, in particular less than 1 mrad and in particular less than 100 μrad, that is to say that the angle between two arbitrary rays in the beam of the EUV individual output beam $9_i$ is less than 20 mrad, in particular less than 2 mrad and in particular less than 200 μrad. This is fulfilled for the variants described below.

Figure 13:
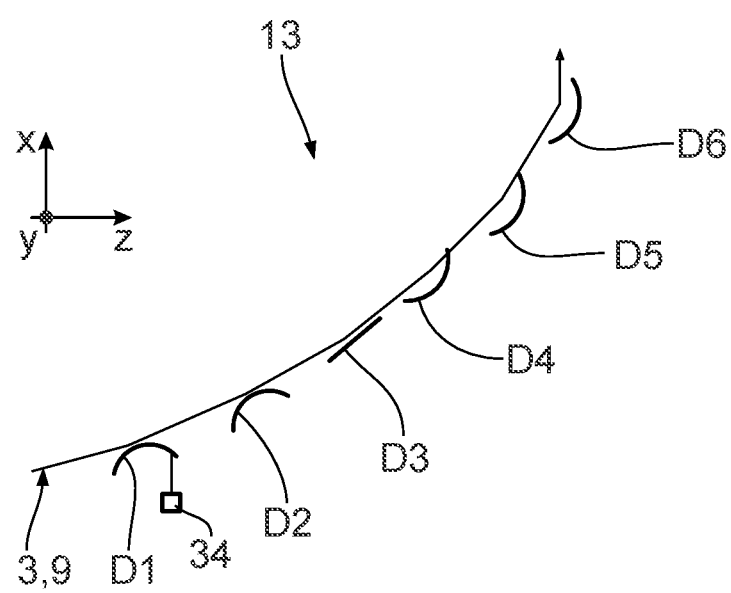
FIG. 13 shows highly schematically, in a sectional view parallel to the incidence plane on the deflection mirrors, an embodiment of the deflection optical unit including, in the beam path of the EUV individual output beam, firstly two convex cylindrical mirrors, one downstream plane mirror and three downstream concave cylindrical mirrors.

The deflection optical unit 13 according to FIG. 13 deflects the coupled-out EUV individual output beam 9 overall by a deflection angle of approximately 75°. The EUV individual output beam 9 is thus incident on the deflection optical unit 13 according to FIG. 13 at an angle of approximately 15° with respect to the horizontal (xy-plane) and leaves the deflection optical unit 13 with a beam direction parallel to the x-axis in FIG. 13. The deflection optical unit 13 has a total transmission for the EUV individual output beam 9 of approximately 55%.

The deflection optical unit 13 according to FIG. 13 has a total of six deflection mirrors D1, D2, D3, D4, D5 and D6, which are numbered consecutively in the order in which the illumination light 3 impinges on them in the beam path. From the deflection mirrors D1 to D6, in each case only a section through the reflection surface thereof is illustrated schematically, wherein a curvature of the respective reflection surface is illustrated in a greatly exaggerated manner. The illumination light 3 impinges on all the mirrors D1 to D6 of the deflection optical unit 13 according to FIG. 13 with grazing incidence in a common deflection incidence plane parallel to the xz plane.

The mirrors D1 and D2 are embodied as convex cylindrical mirrors having a cylinder axis parallel to the y-axis. The mirror D3 is embodied as a plane mirror. The mirrors D4 to D6 are embodied as concave cylindrical mirrors once again with a cylinder axis parallel to the y-axis.

The convex cylindrical mirrors are also referred to as domed mirrors. The concave cylindrical mirrors are also referred to as dished mirrors.

The combined beam shaping effect of the mirrors D1 to D6 is such that the x/y aspect ratio is adapted from the value $1/\sqrt{N}:1$ to the value 1:1. In the x-dimension, therefore, in the ratio the beam cross section is stretched by the factor $\sqrt{N}$.

At least one of the deflection mirrors D1 to D6 or else all of the deflection mirrors D1 to D6 can be embodied as displaceable in the x-direction and/or in the z-direction via assigned actuators 34. An adaptation firstly of the deflecting effect and secondly of the aspect ratio adapting effect of the deflection optical unit 13 can be brought about as a result. Alternatively or additionally, at least one of the deflection mirrors D1 to D6 can be embodied as a mirror that is adaptable with regard to its radius of curvature. For this purpose, the respective mirror D1 to D6 can be constructed from a plurality of individual mirrors that are displaceable with respect to one another by an actuator system, which is not illustrated in the drawing.

The various optical assemblies of the system including the projection exposure apparatuses 1 can be embodied adaptively. It is thus possible to predefine centrally how many of the projection exposure apparatuses 1 are intended to be supplied with EUV individual output beams $9_i$ from the light source 2 with what energetic ratio and what beam geometry is intended to be present for a respective EUV individual output beam 9 after passing through the respective deflection optical unit 13. Depending on the predefined values, the EUV individual output beams $9_i$ can differ in their intensity and also in their setpoint x/y aspect ratio. In particular, it is possible, by adaptively setting the output coupling mirrors $31_i$, to vary the energetic ratios of the EUV individual output beams $9_i$ and, by adaptively setting the deflection optical unit 13, to keep unchanged the size and the aspect ratio of the EUV individual output beam $9_i$ after passing through the deflection optical unit 13.

Further embodiments of deflection optical units that can be used instead of the deflection optical unit 13 according to FIG. 13 in a system including N projection exposure apparatuses 1 are described below with reference to FIGS. 14 to 19. Component parts and functions that have already been explained above with reference to FIGS. 1 to 13, and in particular with reference to FIG. 13, bear the same reference signs and will not be discussed in detail again.

Figure 14:
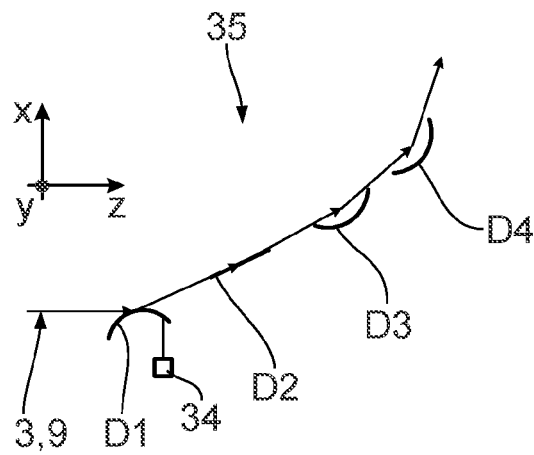
FIG. 14 shows, in an illustration similar to FIG. 13, a further embodiment of the deflection optical unit including one convex cylindrical mirror and three concave cylindrical mirrors that follow sequentially in the EUV beam path.

A deflection optical unit 35 according to FIG. 14 has a total of four mirrors D1, D2, D3, D4 in the beam path of the illumination light 3. The mirror D1 is embodied as a convex cylindrical mirror. The mirrors D2 to D4 are embodied as concave cylindrical mirrors.

More precise optical data can be gathered from the table below. In this case, the first column denotes the radius of curvature of the respective mirror D1 to D4 and the second column denotes the distance between the respective mirror D1 to D3 and the respectively succeeding mirror D2 to D4. The distance relates to that distance which is covered by a central ray within the EUV individual output beam $9_i$ between the corresponding reflections. The unit used in this table and the subsequent tables is in each case mm, unless described otherwise. The EUV individual output beam $9_i$ in this case is incident in the deflection optical unit 13 with a semidiameter $d_{in}$ 2 of 10 mm.

|    | Radius of curvature | Distance to the next mirror |
|----|---------------------|----------------------------|
| D1 | 2922.955800         | 136.689360                 |
| D2 | −49802.074797       | 244.501473                 |
| D3 | −13652.672229       | 342.941568                 |
| D4 | −22802.433560       |                            |

Table regarding FIG. 14

The deflection optical unit 35 according to FIG. 14 expands the x/y aspect ratio by a factor of 3.

Figure 15:
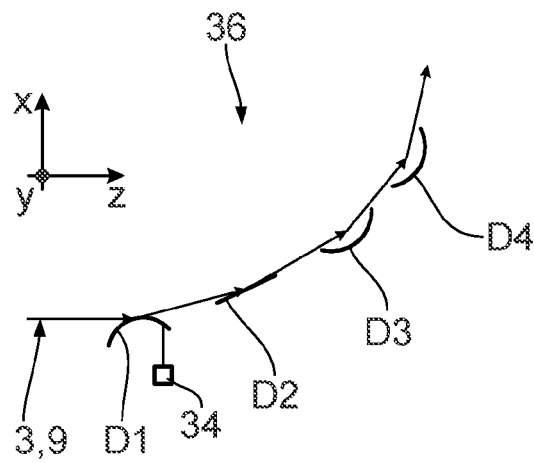
FIG. 15 shows, in an illustration similar to FIG. 13, a further embodiment of the deflection optical unit including, arranged one after another sequentially in the EUV beam path, one convex cylindrical mirror, one plane mirror and two concave cylindrical mirrors.

FIG. 15 shows a further embodiment of a deflection optical unit 36 likewise including four mirrors D1 to D4. The mirror D1 is a convex cylindrical mirror. The mirror D2 is a plane mirror. The mirrors D3 and D4 are two cylindrical mirrors having an identical radius of curvature.

More precise data can be gathered from the following table, which corresponds to the table regarding FIG. 14 in terms of layout.

|    | Radius of curvature | Distance to the next mirror |
|----|---------------------|----------------------------|
| D1 | 5080.620899         | 130.543311                 |
| D2 | 0.000000            | 187.140820                 |
| D3 | −18949.299940       | 226.054877                 |
| D4 | −18949.299940       |                            |

Table regarding FIG. 15

The deflection optical unit 36 according to FIG. 15 expands the x/y aspect ratio of the EUV individual output beam 9 by a factor of 2.

Figure 16:
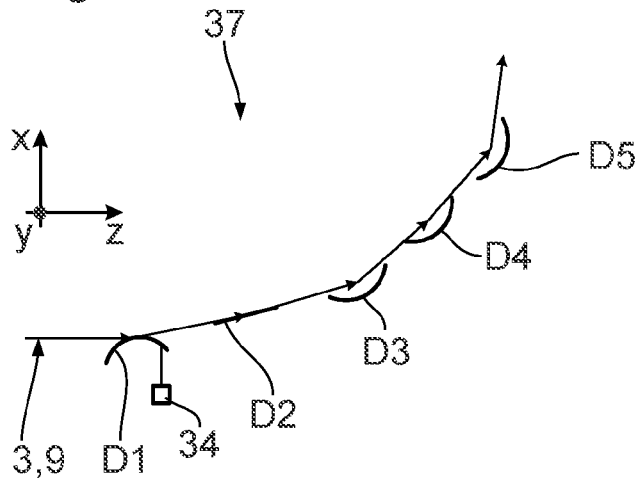
FIG. 16 shows, in an illustration similar to FIG. 13, a further embodiment of the deflection optical unit including, arranged one after another sequentially in the EUV beam path, one convex cylindrical mirror, one plane mirror and three concave cylindrical mirrors.

FIG. 16 shows a further embodiment of a deflection optical unit 37 including five mirrors D1 to D5. The first mirror D1 is a convex cylindrical mirror. The second mirror D2 is a plane mirror. The further mirrors D3 to D5 are three concave cylindrical mirrors.

More precise data can be gathered from the following table, which corresponds to the tables regarding FIGS. 14 and 15 in terms of layout.

|    | Radius of curvature | Distance to the next mirror |
|----|---------------------|----------------------------|
| D1 | 3711.660251         | 172.323866                 |
| D2 | 0.000000            | 352.407636                 |
| D3 | −27795.782391       | 591.719804                 |
| D4 | −41999.478002       | 717.778100                 |
| D5 | −101011.739006      |                            |

Table regarding FIG. 16

The deflection optical unit 37 according to FIG. 16 expands the x/y aspect ratio of the EUV individual output beam 9 by a factor of 5.

A further embodiment of the deflection optical unit 37 differs from the embodiment according to FIG. 16 only in the radii of curvature and the mirror distances, which are indicated in the following table:

|    | Radius of curvature | Distance to the next mirror |
|----|---------------------|------------------------------|
| D1 | 4283.491081         | 169.288384                   |
| D2 | 0.000000            | 318.152124                   |
| D3 | −26270.138665       | 486.408438                   |
| D4 | −41425.305704       | 572.928893                   |
| D5 | −91162.344644       |                              |

Table "Alternative design regarding FIG. 16"

In contrast to the first embodiment according to FIG. 16, this alternative design has an expansion factor of 4 for the x/y aspect ratio.

Yet another embodiment of the deflection optical unit 37 differs from the embodiment according to FIG. 16 in the radii of curvature and the mirror distances, which are indicated in the following table:

|    | Radius of curvature | Distance to the next mirror |
|----|---------------------|------------------------------|
| D1 | 5645.378471         | 164.790501                   |
| D2 | 0.000000            | 269.757678                   |
| D3 | −28771.210382       | 361.997270                   |
| D4 | −55107.732703       | 424.013033                   |
| D5 | −55107.732703       |                              |

Table "Further alternative design" regarding FIG. 16

In contrast to the embodiment described above, this further alternative design has an expansion factor of 3 for the x/y-aspect ratio. The radii of curvature of the last two mirrors D4 and D5 are identical.

Figure 17:
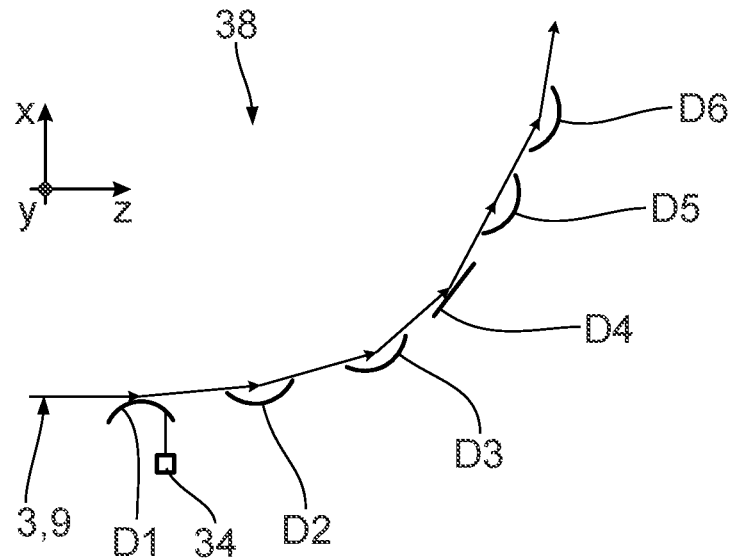
FIG. 17 shows, in an illustration similar to FIG. 13, a further embodiment of the deflection optical unit including, arranged one after another sequentially in the EUV beam path, one convex cylindrical mirror, two downstream concave cylindrical mirrors, one downstream plane mirror and two downstream concave cylindrical mirrors.

FIG. 17 shows a further embodiment of a deflection optical unit 38 including six mirrors D1 to D6. The first mirror D1 is a convex cylindrical mirror. The next two deflection mirrors D2, D3 are in each case concave cylindrical mirrors having an identical radius of curvature. The next deflection mirror D4 is a plane mirror. The last two deflection mirrors D5, D6 of the deflection optical unit 38 are once again concave cylindrical mirrors having an identical radius of curvature.

More precise data can be gathered from the following table, which corresponds to the table regarding FIG. 16 in terms of layout.

|    | Radius of curvature | Distance to the next mirror |
|----|---------------------|------------------------------|
| D1 | 7402.070457         | 197.715713                   |
| D2 | −123031.042588      | 332.795789                   |
| D3 | −123031.042588      | 459.491141                   |
| D4 | 0.000000            | 608.342998                   |
| D5 | −87249.129389       | 857.423893                   |
| D6 | −87249.129389       |                              |

Table regarding FIG. 17

The deflection optical unit 38 has an expansion factor of 5 for the x/y aspect ratio.

Figure 18:
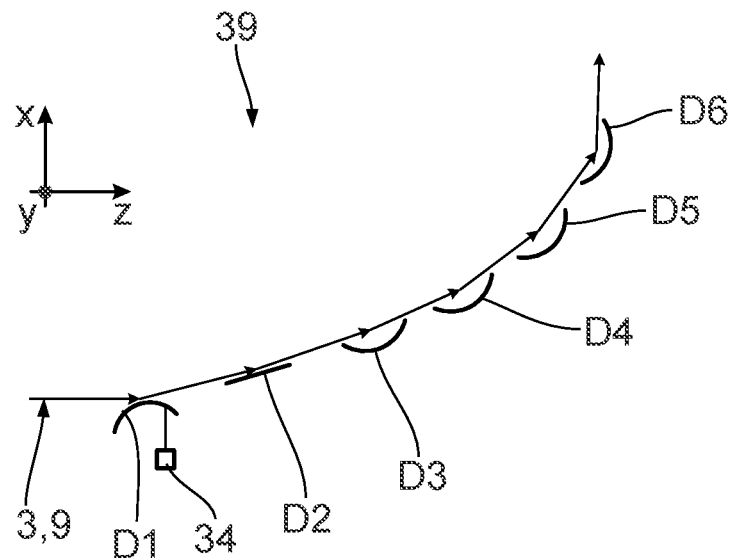
FIG. 18 shows, in an illustration similar to FIG. 13, a further embodiment of the deflection optical unit including, arranged one after another sequentially in the EUV beam path, one convex cylindrical mirror, one downstream plane mirror and four concave cylindrical mirrors following sequentially downstream.

FIG. 18 shows a further embodiment of a deflection optical unit 39 including six mirrors D1 to D6. The first mirror D1 of the deflection optical unit 39 is a convex cylindrical mirror. The downstream second deflection mirror D2 is a plane mirror. The downstream deflection mirrors D3 to D6 are in each case concave cylindrical mirrors. The radii of curvature of the mirrors D3 and D4, on the one hand, and of the mirrors D5 and D6, on the other hand, are identical.

More precise data can be gathered from the following table, which corresponds to the table regarding FIG. 17 in terms of layout.

|    | Radius of curvature | Distance to the next mirror |
|----|---------------------|------------------------------|
| D1 | 7950.882348         | 196.142128                   |
| D2 | 0.000000            | 322.719989                   |
| D3 | −207459.983757      | 451.327919                   |
| D4 | −207459.983757      | 627.317787                   |
| D5 | −90430.481262       | 839.555523                   |
| D6 | −90430.481262       |                              |

Table regarding FIG. 18

The deflection optical unit 39 has an expansion factor of 5 for the x/y aspect ratio.

In an alternative design regarding FIG. 18, the mirror sequence convex/plane/concave/concave/concave/concave is exactly as in the above-described embodiment of the deflection optical unit 39. This alternative design regarding FIG. 18 differs in the specific radii of curvature and mirror distances, as illustrated by the following table:

|    | Radius of curvature | Distance to the next mirror |
|----|---------------------|------------------------------|
| D1 | 10293.907897 S      | 192.462359                   |
| D2 | 0.000000 S          | 285.944981                   |
| D3 | −101659.408806 S    | 360.860262                   |
| D4 | −101659.408806 S    | 451.967976                   |
| D5 | −101659.408806 S    | 517.093086                   |
| D6 | −101659.408806      |                              |

Table "Alternative design regarding FIG. 18"

This alternative design regarding FIG. 18 has an expansion factor of 4 for the x/y aspect ratio of the EUV individual output beam 9.

Figure 19:
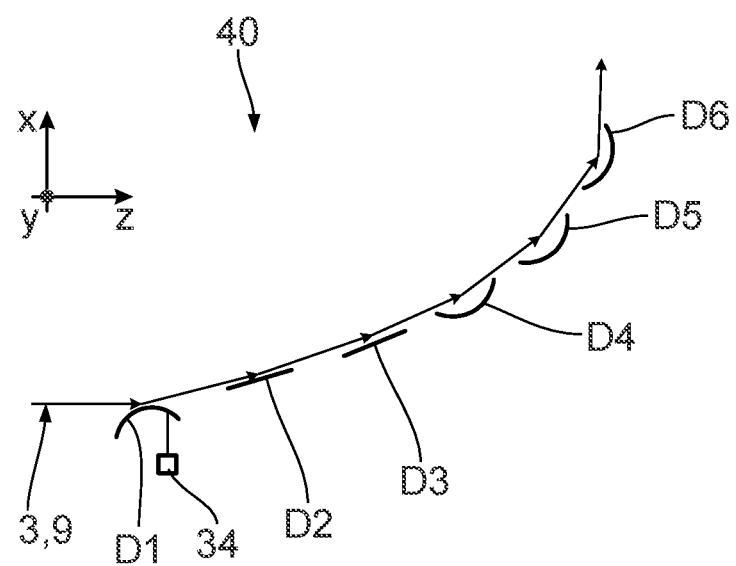
FIG. 19 shows, in an illustration similar to FIG. 13, a further embodiment of the deflection optical unit including, arranged one after another sequentially in the EUV beam path, one convex cylindrical mirror, two plane mirrors following sequentially downstream and three concave cylindrical mirrors following sequentially downstream.

FIG. 19 shows a further embodiment of a deflection optical unit 40 including six mirrors D1 to D6. The first deflection mirror D1 of the deflection optical unit 40 is a convex cylindrical mirror. The two downstream deflection mirrors D2 and D3 are plane mirrors. The downstream deflection mirrors D4 to D6 of the deflection optical unit 40 are concave cylindrical mirrors. The radii of curvature of the last two deflection mirrors D5 and D6 are identical.

More precise data can be gathered from the following table, which corresponds to the table regarding FIG. 18 in terms of layout.

|    | Radius of curvature | Distance to the next mirror |
|----|---------------------|------------------------------|
| D1 | 8304.649871         | 195.440359                   |
| D2 | 0.000000            | 314.991402                   |
| D3 | 0.000000            | 435.995630                   |
| D4 | −237176.552267      | 622.135962                   |
| D5 | −85355.457233       | 852.531832                   |
| D6 | −85355.457233       |                              |

Table regarding FIG. 19

The deflection optical unit 40 has an expansion factor of 5 for the x/y aspect ratio.

In a further variant (not illustrated) the deflection optical unit has a total of eight mirrors D1 to D8. The two leading deflection mirrors D1 and D2 in the beam path of the EUV individual output beam 9 are concave cylindrical mirrors. The four downstream deflection mirrors D3 to D6 are convex cylindrical mirrors. The last two deflection mirrors D7 and D8 of this deflection optical unit are once again concave cylindrical mirrors.

These mirrors D1 to D8 are connected to actuators 34 in a manner comparable with the mirror D1 in FIG. 13, via which actuators a distance between adjacent mirrors D1 to D8 can be predefined.

The following table shows the design of this deflection optical unit including the eight mirrors D1 to D8, wherein the mirror distances for different semidiameters $d_{out}/2$ of the emergent EUV individual output beam $9_i$ are also indicated besides the radii of curvature. In this case, the EUV individual output beam is incident in the deflection optical unit including eight mirrors D1 to D8 with a semidiameter $d_{in}/2$ of 10 mm, such that expansion factors for the x/y aspect ratio of the deflected EUV individual output beam $9_i$ of 4.0, of 4.5 and of 5.0 are realized depending on the distance values indicated.

|    | Radius of curvature [mm] | Distances [mm] 40 mm semidiameter | Distances [mm] for 45 mm semi-diameter | Distances [mm] 50 mm semidiameter |
|----|----|----|----|----|
| D1 | −24933.160828 | 233.314949 | 313.511608 | 355.515662 |
| D2 | −96792.387128 | 261.446908 | 184.453510 | 159.189884 |
| D3 | 13933.786194 | 120.747224 | 278.984993 | 124.048048 |
| D4 | 7248.275614 | 150.818354 | 311.248621 | 385.643707 |
| D5 | 29532.874950 | 204.373669 | 219.654058 | 296.180993 |
| D6 | 100989.002210 | 872.703663 | 698.841397 | 665.602749 |
| D7 | −87933.616578 | 1176.395997 | 1462.002885 | 1318.044212 |
| D8 | −79447.352117 | | | |

In a further embodiment (likewise not illustrated) of the deflection optical unit, four mirrors D1 to D4 are present. The first mirror D1 and the third mirror D3 in the beam path of the EUV individual output beam $9_i$ are embodied as convex cylindrical mirrors and the two further mirrors D2 and D4 are embodied as concave cylindrical mirrors. The following table also indicates, besides the radii of curvature, distance values which are calculated for an input semidiameter $d_{in}/2$ of the EUV individual output beam $9_i$ of 10 mm, that is to say which lead to expansion factors upon passage through this deflection group including the four mirrors D1 to D4 for the x/y aspect ratio of 1.5, (semidiameter $d_{out}/2$ 15 mm), of 1.75 (semidiameter $d_{out}/2$ 17.5 mm) and of 2.0 (semidiameter $d_{out}/2$ 20 mm).

|    | Radius of curvature [mm] | Distances [mm] 15 mm semidiameter | Distances [mm] for 17.5 mm semidiameter | Distances [mm] 20 mm semidiameter |
|----|----|----|----|----|
| D1 | 112692.464497 | 1718.226630 | 6884.616863 | 7163.537958 |
| D2 | −488601.898900 | 250.044362 | 205.433074 | 3185.838011 |
| D3 | 112362.082498 | 1439.444519 | 263.976778 | 175.458248 |
| D4 | −86905.078626 | | | |

The deflection optical unit 13 can be designed in such a way that parallel incident light leaves the deflection optical unit again parallel. The deviation of the directions of rays of the EUV individual output beam $9_i$ that entered the deflection optical unit 13 with parallel incidence, after leaving the deflection optical unit, can be less than 10 mrad, in particular less than 1 mrad and in particular less than 100 μrad.

The mirrors Di of the deflection optical unit 13 can also be embodied without refractive power, that is to say in plane fashion. This is possible, in particular, if the x/y aspect ratio of an EUV collective output beam 7 has an aspect ratio of N:1, wherein N is a number of the projection exposure apparatuses 1 to be supplied by the light source 2. The aspect ratio can also be multiplied by a desired setpoint aspect ratio.

A deflection optical unit 13 composed of mirrors Di without refractive power can consist of three to ten mirrors, in particular of four to eight mirrors, in particular of four or five mirrors.

The light source 2 can emit linearly polarized light; the polarization direction, that is to say the direction of the electric field strength vector, of the illumination light 3 upon impinging on a mirror of the deflection optical unit 13 can be perpendicular to the incidence plane. A deflection optical unit 13 composed of mirrors Di without refractive power can consist of fewer than three mirrors, in particular of one mirror.

In the beam guiding optical unit 10, a focusing assembly 41 is disposed downstream of the respective deflection optical unit in the beam path of the respective EUV individual output beam 9, the focusing assembly also being designated as input coupling optical unit.

Figure 20:
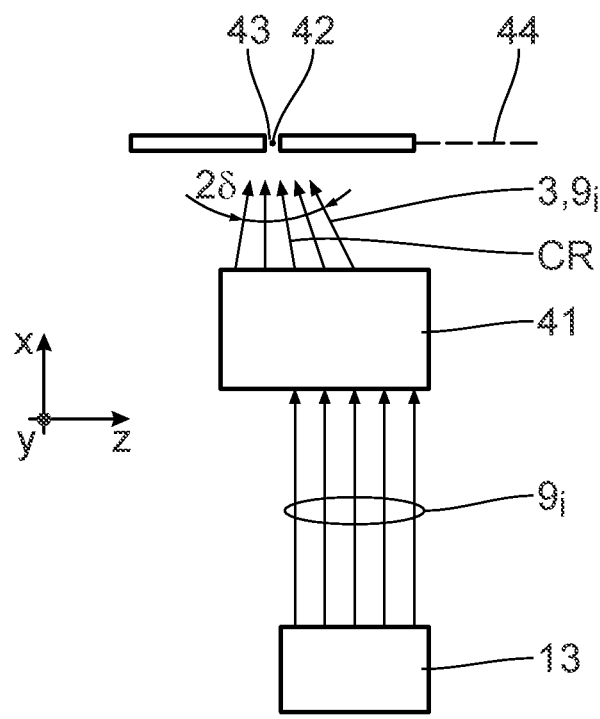
FIG. 20 shows an excerpt from the beam path of one of the EUV individual output beams between the deflection optical unit and an intermediate focal plane for clarifying the function of a focusing assembly or input coupling optical unit of the beam guiding optical unit for guiding the respective EUV individual output beam to the object field.

FIG. 20 schematically shows the function of the input coupling optical unit 41 for one of the EUV individual output beams $9_i$. The focusing assembly 41 transfers the respective EUV individual output beam $9_i$ into an intermediate focus 42 of the beam guiding optical unit 10. The intermediate focus 42 is arranged at the location of a through opening 43 for the illumination light 3. The through opening 43 can be embodied in a building ceiling of a building in which the system including the projection exposure apparatuses 1 is accommodated. The building ceiling runs in an intermediate focal plane 44 of the beam guiding optical unit 10, which is also illustrated in FIG. 1.

The focusing assembly 41 has an effective deflection angle for a central chief ray CR of approximately 10°.

In another configuration, the focusing assembly 41 has an effective deflection angle for a central chief ray CR, wherein the effective deflection angle is between δ/2 and δ, and δ is the angle at the intermediate focus 42 between a central chief ray and a marginal ray. The sine of δ is also referred to as the numerical aperture (NA) of the radiation 3 at the intermediate focus 42.

Figure 21:
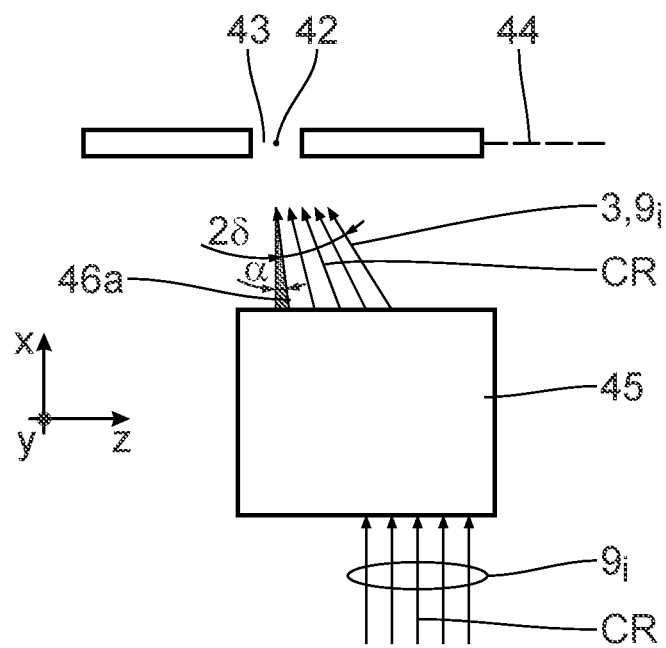
FIG. 21 shows, in an illustration similar to FIG. 20, a further embodiment of the input coupling optical unit.

FIG. 21 illustrates the focusing effect of an alternative focusing assembly 45 that can be used instead of the focusing assembly 41 according to FIG. 20. In contrast to the focusing assembly 41, the focusing assembly 45 deflects all individual rays of the incident EUV individual output beam $9_i$ in the xz-incidence plane in the same deflection direction, namely toward negative y-values. The smallest deflection angle of the focused individual ray 46 of the EUV individual output beam $9_i$ that is illustrated on the far left in FIG. 21 is designated by α in FIG. 21 and is 5° or less.

The focusing assembly 45 has an effective deflection angle for the central chief ray CR of approximately 20°.

In another configuration, the focusing assembly 45 has an effective deflection angle for a central chief ray CR, wherein the effective deflection angle is between δ/2 and δ, and δ is the angle at the intermediate focus 42 between a central chief ray and a marginal ray.

Embodiment variants for focusing assemblies that can be used for the focusing assemblies 41 or 45 are explained below with reference to FIGS. 22 to 25.

FIGS. 22 to 25 in each case illustrate meridional sections through the mirror reflection surfaces involved. Used reflection portions of the mirror surfaces are highlighted by thicker lines. In order to elucidate the surface design ellipsoid-hyperboloid/paraboloid, for the respective mirror shape characteristic parent surface cuts are likewise depicted by thinner lines.

Figure 22:
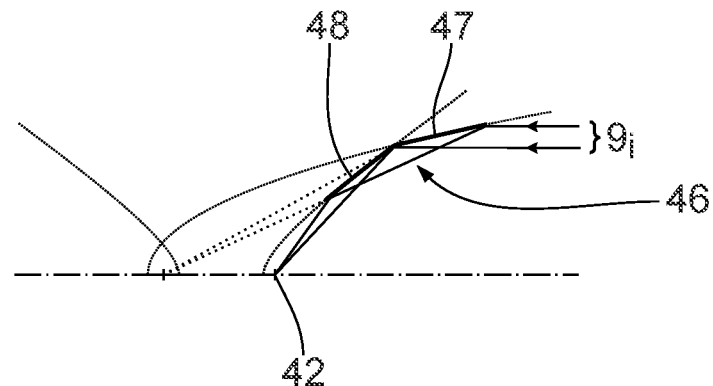
FIG. 22 shows an embodiment of the input coupling optical unit of the Wolter I type.

A focusing assembly 46 according to FIG. 22 has two mirrors disposed downstream in the beam path of the respective EUV individual output beam $9_i$, namely a leading ellipsoidal mirror 47 and a downstream hyperboloidal mirror 48.

An effective deflection angle for the central chief ray CR of the EUV individual output beam $9_i$ is approximately 50° in the case of the focusing assembly 46. The deflection angles for the central chief ray CR upon reflection at the two mirrors 47 and 48 are added in the case of the focusing assembly 46.

The mirrors 47 and 48 are embodied as concave mirrors. The focusing assembly 46 is embodied in the manner of a type I Wolter collector. Information concerning the different types of Wolter collectors can be found in: H. Wolter, Spiegelsysteme streifenden Einfalls als abbildende Optiken für Röntgenstrahlen [Grazing incidence mirror systems as imaging optical units for X-rays], Annalen der Physik, volume 10, pages 94 to 114, 1952.

In an alternative configuration, an effective deflection angle for the central chief ray CR of the EUV output beam $9_i$ in the case of the focusing assembly 46 is less than 40°, in particular less than 30°, in particular less than 15°, and in particular less than 10°.

In an alternative configuration, an effective deflection angle for the central chief ray CR of the EUV output beam $9_i$ in the case of the focusing assembly 46 is less than double the angle between the central chief ray CR and a marginal ray at the intermediate focus 42.

Figure 23:
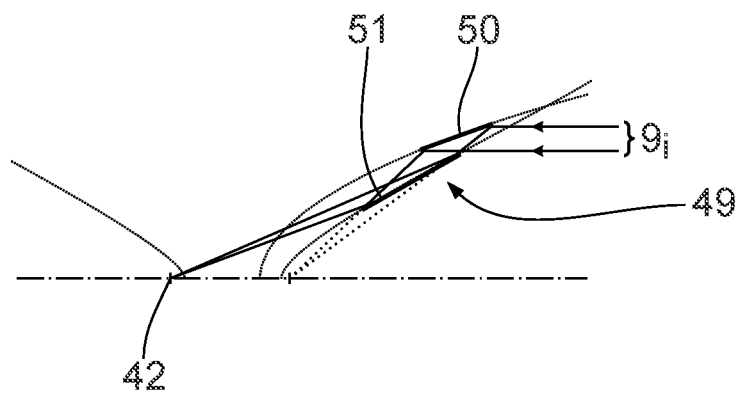
FIG. 23 shows an embodiment of the input coupling optical unit of the Wolter II type.

A focusing assembly 49 according to FIG. 23 likewise includes two mirrors, namely a leading ellipsoidal mirror 50 and a downstream hyperboloidal mirror 51.

The mirror 50 is concave and the mirror 51 is convex.

The deflection angles for the central chief ray CR upon reflection at the mirrors 50 and 51 are subtracted in the case of the focusing assembly 49.

An effective deflection angle for the chief ray CR is approximately 30° in the case of the focusing assembly 49.

The focusing assembly 49 is embodied in the manner of a type II Wolter collector.

In an alternative configuration, the focusing assembly 49 has an effective deflection angle for the chief ray CR of a maximum of 20°, in particular of a maximum of 15°, and in particular of a maximum of 10°.

In one configuration of the focusing assembly 49, the effective deflection angle for the chief ray CR is less than double the angle between the chief ray CR and a marginal ray at the intermediate focus 42.

Figure 24:
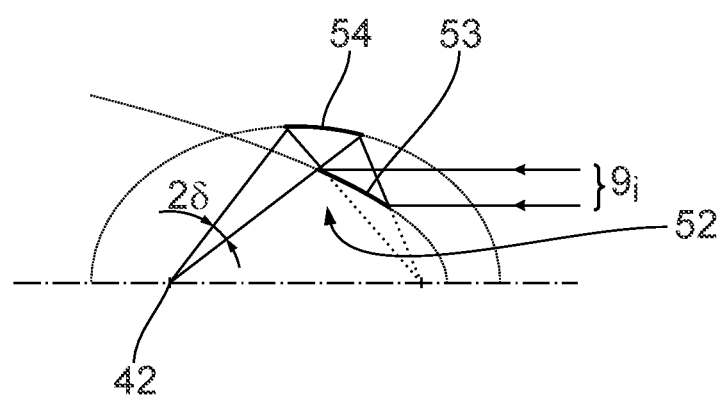
FIG. 24 shows an embodiment of the input coupling optical unit of the Wolter III type.

A focusing assembly 52 according to FIG. 24 likewise has two mirrors disposed downstream of one another in the beam path of the EUV individual output beam $9_i$, namely a leading paraboloidal mirror 53 and a downstream ellipsoidal mirror 54.

The mirror 53 is convex and the mirror 54 is concave.

The deflection angles for the central chief ray CR upon reflection at the mirrors 53 and 54 are subtracted in the case of the focusing assembly 52.

An effective deflection angle for the chief ray CR is approximately 50° in the case of the focusing assembly 52.

The focusing assembly 52 is embodied in the manner of a type III Wolter collector.

Figure 25:
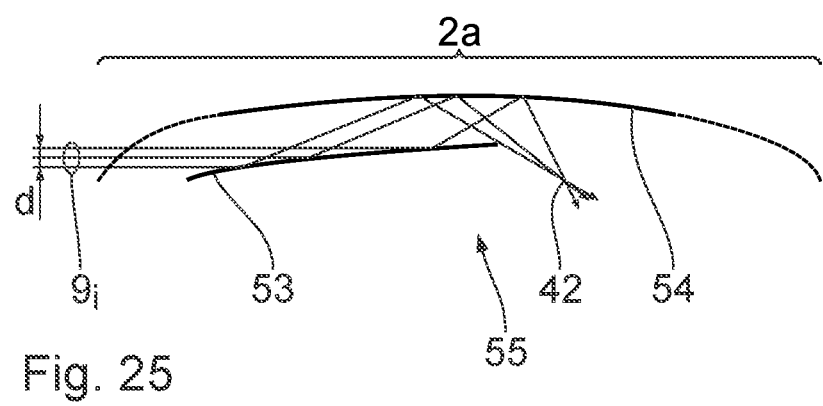
FIG. 25 shows a further embodiment of the input coupling optical unit of the Wolter III type.

FIG. 25 shows a further embodiment of a focusing assembly 52, which is likewise embodied in the manner of a type III Wolter collector. Component parts and functions that have already been explained above with reference to the focusing assemblies according to FIGS. 21 to 24, and in particular with reference to the focusing assembly according to FIG. 24, bear the same reference signs and will not be discussed in detail again.

An output divergence of the EUV individual output beam $9_i$ is predefined by a numerical aperture NA of the EUV individual output beam $9_i$ at the intermediate focus 42. Depending on the numerical aperture NA, the following can be specified approximately for a transmission T of the focusing assembly according to FIG. 25:

$$T=1-0.9NA$$

In this case, the numerical aperture NA is defined as the sine of the angle between a chief ray and a marginal ray at the intermediate focus 42. An equivalent definition states that the NA is the sine of half the beam divergence angle.

A major semiaxis of an ellipsoid that describes the reflection surface of the ellipsoidal mirror 54 has the length a. A structural space 2a for the focusing assembly 55 has a typical dimension of 2a.

The typical structural space dimension 2a is approximately fifty times a beam diameter d of the EUV individual output beam $9_i$ upon incidence in the focusing assembly 55. This ratio is at most weakly dependent on the numerical aperture NA at the intermediate focus 42.

A typical dimension of the reflection surfaces of the ellipsoidal mirror 54 is likewise a. Given a typical extent of the reflection surface of the ellipsoidal mirror 54 of 1.4 m, a diameter of approximately 60 mm follows for the beam diameter d.

The ellipsoidal mirror 54 has a short semiaxis b. The short semiaxis b is perpendicular to the plane of the drawing in FIG. 25. For the ratio of the semiaxes b/a it holds true that:

$$b/a \sim 0.8NA$$

In this case, NA is the numerical aperture at the intermediate focus 42.

The paraboloidal mirror 53 has a focal length f. For the ratio of the long semiaxis a of the ellipsoidal mirror 54 and the focal length f of the paraboloidal mirror it holds true that:

$$a/f > 50$$

During the production of a micro- or nanostructured component via the projection exposure apparatus 1, firstly the reticle 12 and the wafer 24 are provided. Afterwards, a structure on the reticle 12 is projected onto a light-sensitive layer of the wafer 24 with the aid of the projection exposure apparatus 1. Via the development of the light-sensitive layer, a micro- or nanostructure is produced on the wafer 24 and the micro- or nanostructured component is thus produced, for example a semiconductor component in the form of a memory chip.

Further aspects of the projection exposure apparatus 1, in particular of the beam shaping optical unit 6, are described below.

Generally, the beam shaping optical unit 6 serves to shape the collective output beam 7, which is also referred to as transport beam, from the raw beam 4. The collective output beam 7 is split into the individual output beams $9_i$, which are guided to different scanners, by the output coupling optical unit 8.

The transport beam can readily be transported over large distances. For this purpose, it is advantageous that the transport beam has a very small divergence. This is advantageous since the distance between the beam shaping optical unit 6 and the scanners, in particular the illumination optical units 15 of the scanners, need not necessarily be known.

In order to be able to split the transport beam more easily along the scanners, it is advantageous if it does not have a Gaussian profile, as is usually the case for the raw beam 4, but rather a substantially homogeneous intensity profile. This can be achieved, as described above, by the beam shaping optical unit 6, in particular via reflection at freeform surfaces.

A collective output beam 7 having a homogenous intensity profile makes it easier to split the collective output beam 7 uniformly into the different individual output beams $9_i$. It has been recognized according to the disclosure, however, that the homogeneity property is not absolutely necessary to achieve a dose stability of the individual scanners. Furthermore, it has been recognized that the collective output beam 7 need not necessarily have a rectangular intensity profile.

In accordance with one variant, the beam shaping optical unit 6 includes mirrors whose reflection surfaces are not embodied as freeform surfaces. It is possible, in particular, for the beam shaping optical unit 6 to be embodied in such a way that it exclusively includes mirrors whose reflection surfaces are not embodied as freeform surfaces.

The output coupling optical unit 8 and the deflection optical unit 13 include in particular exclusively mirrors on which the illumination radiation 3 impinges with grazing incidence. The deflection of the illumination radiation 3 by the deflection angle desired overall takes place in particular with the aid of a plurality of reflections. The total number of reflections in the output coupling optical unit 8 and the deflection optical unit 13 is in particular at least 2, in particular at least 3, in particular at least 4.

The beam shaping optical unit 6 is arranged between the radiation source 2 and the output coupling optical unit 8, that is to say the optical component via which the collective output beam 7 is split into individual output beams $9_i$.

The beam shaping optical unit 6 is embodied in particular in such a way that the raw beam 4 is magnified in at least one direction perpendicular to the direction of propagation.

The beam shaping optical unit 6 is embodied in particular in such a way that the cross section of the raw beam 4 is magnified in at least one direction, in particular in two directions running obliquely, in particular perpendicularly, with respect to one another. The magnification scale is preferably in the range of between 1:4 and 1:50, in particular at least 1:6, in particular at least 1:8, in particular at least 1:10.

At the input of the beam shaping optical unit 6, the raw beam 4 has in particular a cross section with a diameter in the range of 1 mm to 10 mm. At the output of the beam shaping optical unit 6, the collective output beam 7 has in particular a diameter in the range of 15 mm to 300 mm, in particular of at least 30 mm, in particular at least 50 mm.

At the input of the beam shaping optical unit 6, the raw beam 4 has in particular a divergence in the range of 25 μrad to 100 μrad. At the output of the beam shaping optical unit 6, the divergence of the collective output beam 7 is in particular less than 10 μrad.

The beam shaping optical unit 6 is in particular telecentric. It includes at least two optically effective surfaces. The latter are preferably operated with grazing incidence.

Preferably, the raw beam 4 is magnified in two directions that are oblique, in particular perpendicular, relative to one another. In this case, the beam shaping optical unit 6 includes at least two groups having in each case at least two optically effective surfaces, that is to say in particular at least four optically effective surfaces. The beam shaping optical unit 6 includes in particular the mirror groups 27, 28. The mirror groups 27, 28 include in particular in each case two mirrors $27_i, 28_i$.

The beam shaping optical unit 6 includes in particular at least one beam shaping mirror group 27, 28 having in each case at least two mirrors $27_i, 28_i$. The mirrors $27_i, 28_i$ can have in each case a surface profile which is constant along a local coordinate and has a spherical course along a coordinate orthogonal thereto. This leads to a magnification of the raw beam 4 in just a single direction. It is possible to use two mirror groups 27, 28 of this type in order to magnify the raw beam 4 in two different directions, in particular two orthogonal directions.

The mirrors $27_i, 28_i$ can also have a spherical course having a radius $R_1$ of curvature along a first local coordinate and a spherical course having a radius $R_2$ of curvature along a coordinate orthogonal thereto. $R_1$ and $R_2$ can in this case be identical or different. Such a variant leads to a magnification of the raw beam 4 in two mutually perpendicular directions.

The mirrors $27_i, 28_i$ can also have in each case a surface profile corresponding to an ellipsoid. This also leads to a magnification in two directions.

Preferably, the beam shaping optical unit 6 is arranged and embodied in such a way that the raw beam, in particular the cross section thereof, is magnified in relation to a direction running parallel to the ground, that is to say parallel to a horizontal direction. The beam shaping optical unit 6 is embodied in particular in such a way that the collective output beam 7 at the output of the beam shaping optical unit 6 runs parallel to the ground.

Further aspects and variants of the beam shaping optical unit 6 are described below in a brief summary.

As was described above, it is not absolutely necessary for the raw beam 4 to be homogenized via the beam shaping optical unit 6. However, a homogenization of the raw beam 4 may be advantageous. It may lead in particular to a higher material lifetime. It may also simplify the producibility, in particular of the output coupling optical unit 8.

Depending on which aspect is of primary importance, it may be expedient and provision may be made for the raw beam 4 to be homogenized just in one direction. In this regard, it has been recognized that a homogenization of the raw beam 4 in one direction has a positive effect on the material lifetime, while a homogenization in a direction orthogonal thereto is advantageous for the producibility, in particular of the output coupling optical unit 8.

Since, as was described above, the beam shaping optical unit 6 has for these two directions in each case separate groups 27, 28 of mirrors $27_i, 28_i$, in particular separate mirror pairs, for example one of the mirror pairs can be embodied as tori, and the other as freeform surfaces. This leads to a cost saving.

Figure 26:
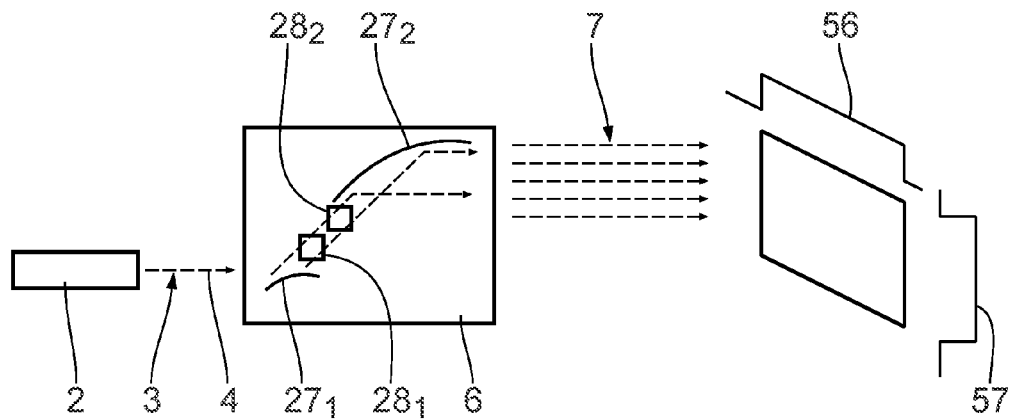
FIGS. 26 to 28 show different variants of a beam shaping optical unit.
Figure 27:
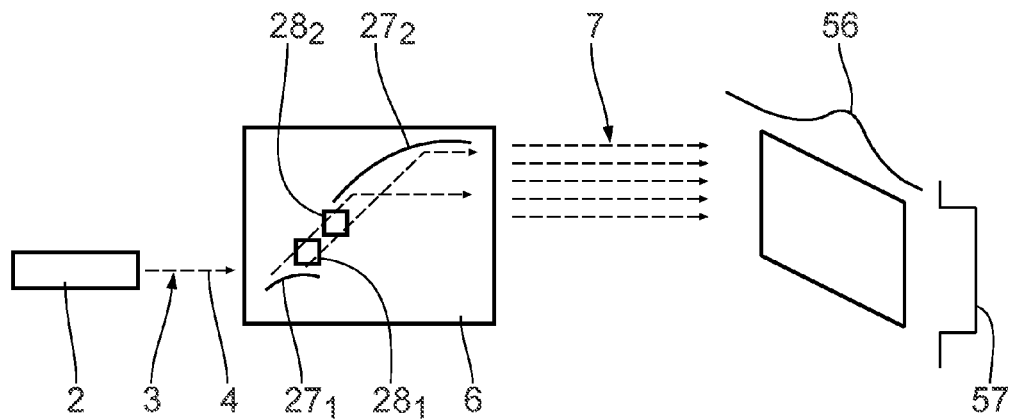
Figure 28:
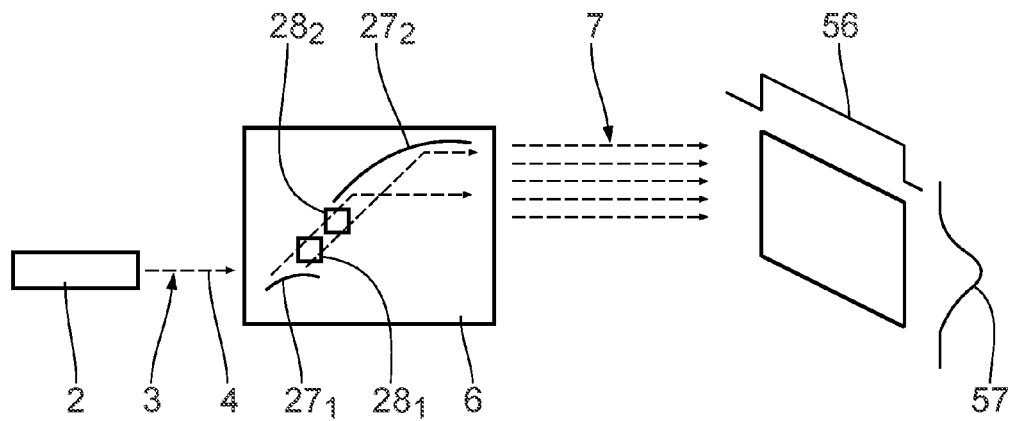

Different variants of the homogenization of the raw beam 4 via the beam shaping optical unit 6 are illustrated schematically in FIGS. 26 to 28. FIG. 26 schematically illustrates the embodiment of a beam shaping optical unit 6 via which the raw beam 4 is homogenized in two mutually perpendicular directions. This is clarified by a stepped course of an intensity profile 56 in a first direction and a stepped course of an intensity profile 57 in a second direction. The intensity profiles 56, 57 relate to the intensity of the illumination radiation 3 in a cross section of the collective output beam 7 perpendicular to the direction of propagation thereof.

FIG. 27 illustrates a variant of the beam shaping optical unit 6 in which the raw beam 4 is homogenized only in the second direction. Accordingly, the intensity profile 57 has a stepped course. The intensity profile 56 has an inhomogeneous, in particular a non-stepped, in particular a Gaussian, course. In other words, a local increase in intensity occurs in a central region of the collective output beam 7, which runs in the vertical direction in FIG. 27.

FIG. 28 correspondingly illustrates a variant of the beam shaping optical unit 6 in which, in comparison with the embodiment in accordance with FIG. 27, the raw beam 4 is homogenized precisely in the other direction. In this embodiment, the intensity profile 56 in the first direction has a stepped course. The intensity profile 57 in the second direction is not homogeneous, in particular non-stepped, in particular Gaussian. The intensity is increased in a horizontally running central region.

Intermediate steps are also possible. It is possible, in particular, to partially homogenize the raw beam 4 in one or both directions. It is possible, in particular, to homogenize the raw beam 4 in one or both directions in such a way that the intensity of the illumination radiation at different spatial coordinates in the direction differs in each case only by a maximum of 25%. Intensity spikes, in particular, can be avoided by a corresponding homogenization. This has an advantageous effect in particular on the material lifetime.

The intensity profile 56 and/or the intensity profile 57 can have in particular a form which is neither exactly Gaussian nor exactly stepped, but rather has a Gaussian and a stepped proportion. The intensity profile 56 and/or the intensity profile 57 can be described in particular as a sum of a Gaussian proportion and a stepped proportion.

An inhomogeneity of the collective output beam 7 in the second direction can be compensated for by the fact that the regions of the collective output beam 7 which are coupled out into the different individual output beams $9_i$ by the output coupling optical unit 8 are of different sizes. The size of the regions makes it possible to predefine what proportion with the illumination radiation 3 in the collective output beam 7 is guided to the individual scanners.

Figure 29:
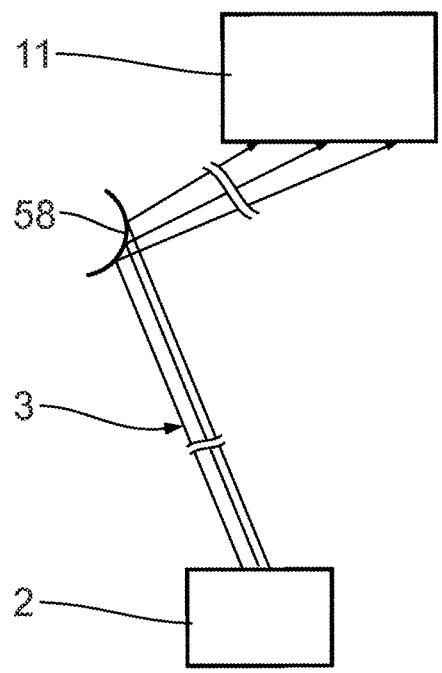
FIG. 29 shows a schematic illustration of a beam expanding component part.

FIG. 29 illustrates an optical element for magnifying the cross section of a beam with illumination radiation 3. For magnifying the beam cross section, a mirror 58 having a convex reflection surface is arranged in the beam path of the illumination radiation 3. The mirror 58 is also referred to as a diverging mirror.

The mirror 58 can have a substantially cylindrical reflection surface, that is to say can be convex in a first direction and plane in a second direction, running perpendicular to the first direction. It can also be convex in both directions. In this case, the radii of curvature can be identical or different. In principle, it is also possible to embody the mirror 58 with adjustable radii of curvature, in particular radii of curvature that are adjustable by an actuator system. The selection of the radii of curvature of the mirror 58 relative to the first direction and the second direction perpendicular thereto makes it possible to influence the magnification of the cross section in the corresponding directions in a targeted manner.

The mirror 58 can thus be used for the targeted magnification of the cross section of the beam or beam of rays with illumination radiation 3.

What is claimed is:

1. A beam guiding optical unit, comprising:
a focusing assembly configured to transfer an EUV individual output beam into an intermediate focus of the beam guiding optical unit,
wherein:
the focusing assembly comprises:
an ellipsoidal mirror with a major semiaxis a of the ellipsoidal mirror; and
a paraboloidal mirror with a focal length f of the paraboloidal mirror,
a ratio a to f is greater than 50; and
the beam guiding unit is an EUV lithography beam guiding unit.

2. The beam guiding optical unit of claim 1, further comprising a deflection optical unit which comprises a plurality of deflection mirrors on which EUV radiation impinges in a common deflection incidence plane with grazing incidence during use of the deflection optical unit, wherein:
the plurality of deflection mirrors comprises at least four deflection mirrors which jointly have a deflection effect in the common deflection incidence plane of more than 70°; and
at least one of the deflection mirrors is selected from the group consisting of a convex cylindrical mirror and a concave cylindrical mirror.

3. The beam guiding optical unit of claim 2, wherein at least one of the deflection mirrors is displaceable in a driven fashion.

4. The beam guiding optical unit of claim 2, wherein at least one of the deflection mirrors has a radius of curvature that is variable in a driven fashion.

5. A system comprising:
a beam guiding unit according to claim 1; and
a beam shaping optical unit which comprises at least two groups of mirrors on which EUV radiation impinges with grazing incidence during use of the beam shaping optical unit,
wherein each mirror group has a common group incidence plane, the group incidence planes of the mirror groups differ from one another, and the beam shaping unit is an EUV lithography beam shaping unit.

6. The system of claim 5, wherein:
the beam shaping optical unit comprises first, second and third groups of mirrors;
all mirrors of the first group of mirrors are in a beam path downstream of a first mirror of the second group of mirrors; and
all the mirrors of the first group of mirrors are upstream of a last mirror of the third group of mirrors.

7. The system of claim 5, wherein the angles of incidence of the EUV radiation on all mirrors of one of the mirror groups are of identical magnitude.

8. The system of claim 5, wherein the angles of incidence of the EUV radiation on at least two mirrors of one of the mirror groups differ.

9. The system of claim 8, wherein, projected onto the common group incidence plane of the group of mirrors with different angles of incidence, a generated EUV collective output beam runs in the same direction as an EUV raw beam that is incident in the beam shaping optical unit.

10. An illumination system, comprising:
a beam shaping optical unit configured to generate an EUV collective output beam from an EUV raw beam of a synchrotron-radiation-based light source;
an output coupling optical unit configured to generate a plurality of EUV individual output beams from the EUV collective output beam;
a beam guiding optical unit configured to guide the EUV individual output beams toward an object field in which a lithography mask is arrangable,
wherein the beam guiding optical unit is a beam guiding optical unit according to claim 1, and the illumination system is an EUV projection lithography illumination system.

11. The illumination system of claim 10, wherein:
the beam shaping optical unit is configured to generate the EUV collective output beam with an aspect ratio contribution of $1:\sqrt{N}$; and
at least one member selected from the group consisting of the output coupling optical unit and the beam guiding optical unit is configured to subsequently generate a number N of the EUV individual output beams with an aspect ratio contribution of in each case 1:1.

12. The illumination system of claim 10, further comprising an EUV light source.

13. An apparatus, comprising:
an illumination system comprising:
a beam shaping optical unit configured to generate an EUV collective output beam from an EUV raw beam of a synchrotron-radiation-based light source;
an output coupling optical unit configured to generate a plurality of EUV individual output beams from the EUV collective output beam; and
a beam guiding optical unit configured to guide the EUV individual output beams toward an object field in which a lithography mask is arrangeable; and
a projection optical unit configured to image the object field into an image field,
wherein the beam guiding optical unit is a beam guiding optical unit according to claim 1, the apparatus is an EUV lithography projection exposure apparatus.

14. A method of using an EUV lithography projection exposure apparatus comprising an illumination system and a projection optical unit, the method comprising:
using the illumination system to illuminate at least a portion of a reticle comprising a structure;
using the projection optical unit to project the illuminated structure of the reticle onto a light-sensitive layer of a wafer,
wherein:
the illumination system comprises:
a beam shaping optical unit configured to generate an EUV collective output beam from an EUV raw beam of a synchrotron-radiation-based light source;
an output coupling optical unit configured to generate a plurality of EUV individual output beams from the EUV collective output beam; and
a beam guiding optical unit configured to guide the EUV individual output beams toward the reticle; and
the beam guiding optical unit is a beam guiding optical unit according to claim 1.

15. The beam guiding optical of claim 1, further an illumination optical unit arranged downstream of the focusing assembly, wherein the illumination optical unit comprises a field facet mirror and a pupil facet mirror.

16. The beam guiding optical unit of claim 1, wherein the focusing assembly has an effective deflection angle for a central chief ray of the EUV output beam, and the effective deflection angle is less than double an angle between a central chief ray and a marginal ray at the intermediate focus of the beam guiding optical unit.

17. The beam guiding optical unit of claim 1, wherein the focusing assembly comprises a member selected from the group consisting of a Wolter mirror group of type I, a Wolter mirror group of type II, and a Wolter mirror group of type III.

18. The beam guiding optical unit of claim 1, wherein mirrors of the focusing assembly are arranged sequentially in a beam path of the EUV individual output beam.

19. The beam guiding optical unit of claim 1, wherein a structural space of the focusing assembly along a beam path of the EUV individual output beam is approximately double a magnitude of a major semiaxis of an ellipsoidal mirror of the focusing assembly.

20. The beam guiding optical unit of claim 1, wherein a structural space of the focusing assembly along a beam path of the EUV individual output beam is approximately fifty times a magnitude of a diameter of the EUV individual output beam upon entering the focusing assembly.

21. A beam guiding optical unit, comprising:
a focusing assembly configured to transfer an EUV individual output beam into an intermediate focus of the beam guiding optical unit,
wherein:
the focusing assembly has an effective deflection angle for a central chief ray of the EUV output beam;
the effective deflection angle is less than double an angle between a central chief ray and a marginal ray at the intermediate focus of the beam guiding optical unit; and
the beam guiding unit is an EUV lithography beam guiding unit.

22. A system comprising:
a beam guiding unit; and
a beam shaping optical unit-which comprises at least two groups of mirrors on which EUV radiation impinges with grazing incidence during use of the beam shaping optical unit,
wherein each mirror group has a common group incidence plane, the group incidence planes of the mirror groups differ from one another, and the beam shaping unit is an EUV lithography beam shaping unit, and
wherein the beam guiding unit comprises a focusing assembly configured to transfer an EUV individual output beam into an intermediate focus of the beam guiding optical unit, and the focusing assembly comprises a Wolter mirror group of type III, and the beam guiding unit is an EUV lithography beam guiding unit.

* * * * *

UNITED STATES PATENT AND TRADEMARK OFFICE
CERTIFICATE OF CORRECTION

PATENT NO. : 9,958,783 B2
APPLICATION NO. : 15/152670
DATED : May 1, 2018
INVENTOR(S) : Michael Patra and Ralf Mueller Page 1 of 1

It is certified that error appears in the above-identified patent and that said Letters Patent is hereby corrected as shown below:

On the Title Page

Column 1 (Notice), Line 3: After "0 days." delete "days.".

In the Specification

Column 3, Line 47: Delete "beamthat" and insert -- beam that --, therefor.

Column 4, Line 53: Delete "-radition-" and insert -- -radiation- --, therefor.

Column 7, Line 28: Delete "synchrontron-" and insert -- synchrotron- --, therefor.

Column 7, Line 45: After "dimensions" delete "sions".

In the Claims

Column 27, Line 51 (approx.): In Claim 15, after "optical" insert -- unit --.

Signed and Sealed this
Eighteenth Day of September, 2018

Andrei Iancu
*Director of the United States Patent and Trademark Office*